(12) United States Patent
Lu et al.

(10) Patent No.: US 11,977,776 B2
(45) Date of Patent: May 7, 2024

(54) FLASH MEMORY CONTROLLER AND METHOD CAPABLE OF SENDING READ COMMAND OR DATA TOGGLE COMMAND TO ASK FOR FLASH MEMORY DEVICE RETURN MORE PLANE DATA OF DIFFERENT PLANES

(71) Applicant: Silicon Motion, Inc., Hsinchu County (TW)

(72) Inventors: Tsu-Han Lu, Hsinchu (TW); Hsiao-Chang Yen, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 261 days.

(21) Appl. No.: 17/679,111

(22) Filed: Feb. 24, 2022

(65) Prior Publication Data
US 2023/0266921 A1 Aug. 24, 2023

(51) Int. Cl.
*G06F 3/06* (2006.01)

(52) U.S. Cl.
CPC .......... *G06F 3/0659* (2013.01); *G06F 3/0604* (2013.01); *G06F 3/0613* (2013.01); *G06F 3/0635* (2013.01); *G06F 3/0679* (2013.01)

(58) Field of Classification Search
CPC .... G06F 3/0659; G06F 3/0604; G06F 3/0613; G06F 3/0635; G06F 3/0679
See application file for complete search history.

(56) References Cited

U.S. PATENT DOCUMENTS 9,122,611 B2 9/2015 Yeh
9,229,854 B1 1/2016 Kuzmin
9,524,799 B2 * 12/2016 Desireddi ............ G11C 29/021
(Continued)

FOREIGN PATENT DOCUMENTS

CN 111179994 A 5/2020
CN 113760794 A 12/2021
(Continued)

OTHER PUBLICATIONS

Komala, M., VinayKumar Shankar Amathe, and K. R. Nataraj. "Controller Design for Multichannel NAND Flash Memory for Higher Efficiency in SSD'S." Apr. 2015 (Year: 2015).*
(Continued)

*Primary Examiner* — Nicholas J Simonetti
(74) *Attorney, Agent, or Firm* — Winston Hsu

(57) ABSTRACT

A flash memory device is disclosed. The memory cell array has a first plane and a second plane and stores a first data unit and a second data unit. The data register buffers the first data unit and the second data unit transmitted from the memory cell array when a read command or a data toggle command is received and stored by the command register. The control circuit performs a data toggle operation to control the data register selecting and transferring the first data unit and the second data unit to the I/O control circuit to make the I/O control circuit sequentially transmit the first data unit and the second data unit to the flash memory controller through a specific communication interface in response to the read command or the data toggle command. The transmission of the first data unit is followed by the transmission of the second data unit.

20 Claims, 32 Drawing Sheets

(56) References Cited

U.S. PATENT DOCUMENTS

| | | |
|---|---|---|
| 10,002,671 B2 | 6/2018 | Shimizu |
| 10,339,046 B1 | 7/2019 | Hsieh |
| 10,803,946 B2 | 10/2020 | Imamoto |
| 10,877,696 B2 | 12/2020 | Wakchaure |
| 11,182,301 B2 | 11/2021 | Ahn |
| 2004/0233714 A1 | 11/2004 | Morikawa |
| 2008/0055993 A1 | 3/2008 | Lee |
| 2009/0049232 A1 | 2/2009 | Brahmadathan |
| 2009/0052397 A1 | 2/2009 | Meylan |
| 2009/0196103 A1 | 8/2009 | Kim |
| 2011/0161565 A1 | 6/2011 | Chua |
| 2011/0185145 A1 | 7/2011 | Moro |
| 2011/0191520 A1* | 8/2011 | Kano .................. G06F 3/0688 711/E12.007 |
| 2012/0155175 A1 | 6/2012 | Kang |
| 2015/0074486 A1 | 3/2015 | Gaertner |
| 2015/0262630 A1 | 9/2015 | Shirakawa |
| 2019/0087101 A1 | 3/2019 | Endo |
| 2019/0121570 A1 | 4/2019 | Kim |
| 2019/0235789 A1 | 8/2019 | Yan |
| 2019/0369910 A1 | 12/2019 | Kim |
| 2020/0151106 A1 | 5/2020 | Ahn |
| 2020/0310643 A1 | 10/2020 | Li |
| 2020/0372940 A1 | 11/2020 | Park |
| 2020/0395090 A1 | 12/2020 | Kang |
| 2021/0149594 A1 | 5/2021 | Shah |
| 2021/0327516 A1 | 10/2021 | Kim |
| 2022/0059171 A1 | 2/2022 | Goss |
| 2022/0317930 A1 | 10/2022 | Zhi |
| 2023/0063564 A1 | 3/2023 | Fisher |
| 2023/0065231 A1 | 3/2023 | Wu |
| 2023/0266895 A1 | 8/2023 | Lu |
| 2023/0280929 A1 | 9/2023 | Lu |

FOREIGN PATENT DOCUMENTS

| | | |
|---|---|---|
| CN | 113808649 A | 12/2021 |
| TW | 201329987 A1 | 7/2013 |
| TW | 1443671 B | 7/2014 |
| TW | 201643874 A | 12/2016 |
| TW | 201814489 A | 4/2018 |
| TW | 201933104 A | 8/2019 |
| TW | 201937381 A | 9/2019 |
| TW | 202028985 A | 8/2020 |
| TW | 202034173 A | 9/2020 |
| TW | I711923 B | 12/2020 |
| TW | 202203213 A | 1/2022 |

OTHER PUBLICATIONS

Lu, the specification, including the claims, and drawings in the U.S. Appl. No. 17/679,103, filed Feb. 24, 2022.

Lu, the specification, including the claims, and drawings in the U.S. Appl. No. 17/679,116, filed Feb. 24, 2022.

Lu, the specification, including the claims, and drawings in the U.S. Appl. No. 17/679,120, filed Feb. 24, 2022.

Lu, the specification, including the claims, and drawings in the U.S. Appl. No. 17/679,125, filed Feb. 24, 2022.

Lu, the specification, including the claims, and drawings in the U.S. Appl. No. 17/679,136, filed Feb. 24, 2022.

* cited by examiner

Flash memory controller send command for copy back read operation

Flash memory controller send command for erase operation

Flash memory controller send command for write operation of SLC mode

Flash memory controller send command for write operation of SLC mode

Flash memory controller send command for write operation of SLC mode

Flash memory controller send command for write operation

Flash memory controller send command for write operation

Flash memory controller send command for write operation

Flash memory controller send command for write operation

FLASH MEMORY CONTROLLER AND METHOD CAPABLE OF SENDING READ COMMAND OR DATA TOGGLE COMMAND TO ASK FOR FLASH MEMORY DEVICE RETURN MORE PLANE DATA OF DIFFERENT PLANES

BACKGROUND OF THE INVENTION

1. Field of the Invention

The invention relates to a flash memory data communication scheme, and more particularly to a flash memory device, a flash memory controller, and methods capable of providing multiple plane operations.

2. Description of the Prior Art

Generally speaking, based on the circuit design of a conventional flash memory device, a conventional flash memory controller, which is externally coupled to the flash memory device, needs to issue and send multiple read commands to respectively read out the plane data of multiple different planes of the conventional flash memory device. The command sequence is more complicated and needs to wait for a longer time period.

SUMMARY OF THE INVENTION

Therefore one of the objectives of the invention is to provide a flash memory device, a flash memory controller, and corresponding methods, to solve the above-mentioned problems.

According to embodiments of the invention, a flash memory device, to be used in a storage device and coupled to a flash memory controller of the storage device through a specific communication interface, includes an input/output (I/O) control circuit, a command register, a memory cell array, and a data register, and a control circuit. The memory cell array has a first plane and a second plane and at least stores a first data unit corresponding to the first plane and a second data unit corresponding to the second plane different from the first plane. The data register buffers the first data unit and the second data unit transmitted from the memory cell array when a read command or a data toggle command is received and stored by the command register. The control circuit performs a data toggle operation to control the data register selecting and transferring the first data unit and the second data unit to the I/O control circuit to make the I/O control circuit sequentially transmit the first data unit and the second data unit to the flash memory controller through a specific communication interface in response to the read command or the data toggle command. The transmission of the first data unit is followed by the transmission of the second data unit.

According to the embodiments, a method of a flash memory device to be used in a storage device and coupled to a flash memory controller of the storage device through a specific communication interface is disclosed. The method comprises: using a memory cell array for at least storing a first data unit corresponding to the first plane and a second data unit corresponding to the second plane different from the first plane; using the data register to buffer the first data unit and the second data unit transmitted from the memory cell array when a read command or a data toggle command, transmitted from the flash memory controller and through the I/O control circuit, is received and stored by the command register; and performing a data toggle operation to control the data register selecting and transferring the first data unit and the second data unit to the I/O control circuit to make the I/O control circuit sequentially transmit the first data unit and the second data unit to the flash memory controller through the specific communication interface in response to the read command or the data toggle command, transmitted from the flash memory controller through the I/O control circuit and stored in the command register. The transmission of the first data unit is followed by a transmission of the second data unit.

According to the embodiments, a flash memory controller to be used in a storage device and coupled to a flash memory device of the storage device through a specific communication interface is disclosed. The flash memory controller comprises an input/output (I/O) circuit and a processor. The I/O circuit is coupled to the flash memory device through the specific communication interface, and it is used for sending commands and data between the flash memory device and the processor. The processor is coupled to the I/O circuit, and used for sending a specific read command or a data toggle command through the I/O circuit and the specific communication interface into the flash memory device, to make the flash memory device perform a data toggle operation to control the flash memory device's data register selecting and transferring a first data unit and a second data unit to the flash memory device's I/O control circuit to make the I/O control circuit sequentially transmit the first data unit and the second data unit to the flash memory controller through the specific communication interface in response to the specific read command or the data toggle command. The transmission of the first data unit is followed by a transmission of the second data unit, and the first data unit and the second data unit are respectively associated with different planes of the flash memory device.

According to the embodiments, a method of a flash memory controller to be used in a storage device and coupled to a flash memory device of the storage device through a specific communication interface is disclosed. The method comprises: providing an input/output (I/O) circuit coupled to the flash memory device through the specific communication interface, used for sending commands and data between the flash memory device and a processor; and controlling the processor sending a specific read command or a data toggle command through the I/O circuit and the specific communication interface into the flash memory device, to make the flash memory device perform a data toggle operation to control the flash memory device's data register selecting and transferring a first data unit and a second data unit to the flash memory device's I/O control circuit to make the I/O control circuit sequentially transmit the first data unit and the second data unit to the flash memory controller through the specific communication interface in response to the specific read command or the data toggle command. The transmission of the first data unit is followed by a transmission of the second data unit, and the first data unit and the second data unit are respectively associated with different planes of the flash memory device.

According to the embodiments, a flash memory controller to be used in a storage device and coupled to a flash memory device of the storage device through a specific communication interface is disclosed. The flash memory controller comprises an input/output (I/O) circuit and a processor. The I/O circuit is coupled to the flash memory device through the specific communication interface, and it is used for sending commands and data between the flash memory device and a processor. The processor is coupled to the I/O circuit, and it is used for controlling the I/O circuit sending a data toggle set-feature signal to the flash memory device to enable, disable, or configure a data toggle operation of the flash memory device, wherein the data toggle operation of the flash memory device is arranged to make the flash memory device control the flash memory device's data register selecting and transferring a first data unit and a second data unit to the flash memory device's I/O control circuit to make the I/O control circuit sequentially transmit the first data unit and the second data unit to the flash memory controller through the specific communication interface in response to a specific read command or a data toggle command transmitted by the flash memory controller. The transmission of the first data unit is followed by a transmission of the second data unit, and the first data unit and the second data unit are respectively associated with different planes of the flash memory device.

According to the embodiments, a method of a flash memory controller to be used in a storage device and coupled to a flash memory device of the storage device through a specific communication interface is disclosed. The method comprises: providing an input/output (I/O) circuit coupled to the flash memory device through the specific communication interface for sending commands and data between the flash memory device and a processor; and, controlling the processor to control the I/O circuit sending a data toggle set-feature signal to the flash memory device to enable, disable, or configure a data toggle operation of the flash memory device; the data toggle operation of the flash memory device is arranged to make the flash memory device control the flash memory device's data register selecting and transferring a first data unit and a second data unit to the flash memory device's I/O control circuit to make the I/O control circuit sequentially transmit the first data unit and the second data unit to the flash memory controller through the specific communication interface in response to a specific read command or a data toggle command transmitted by the flash memory controller. The transmission of the first data unit is followed by a transmission of the second data unit, and the first data unit and the second data unit are respectively associated with different planes of the flash memory device.

According to the embodiments, a flash memory device to be used in a storage device and coupled to a flash memory controller of the storage device through a specific communication interface is disclosed. The flash memory device comprises an I/O control circuit, a command register, an address register, a memory cell array, a data register, at least one address decoder, and an address control circuit. The I/O control circuit is coupled to the flash memory controller through the specific communication interface. The command register is coupled to the I/O control circuit and used for buffering command information sent from the flash memory controller and transmitted through the I/O control circuit. The address register is coupled to the I/O control circuit and used for buffering address information sent from the flash memory controller and transmitted through the I/O control circuit. The memory cell array at least has a first plane and a second plane which is different from the first plane. The data register is coupled to the memory cell array. The at least one address decoder is coupled to the memory cell array and the data register. The address control circuit is coupled to the address register and the at least one address decoder, and it is used for controlling the at least address decoder accessing at least one data unit, indicated by the address information transmitted from the address register, for at least one plane of the memory cell array. The address information is first address information which is used for the first plane and is carried by a single command sequence. The address control circuit is arranged to automatically generate second address information associated with the second plane according to the first address information of the first plane, and then selecting multiple data units at the first plane and the second plane based on the first address information and the second address information in response to the command information buffered in the command register so as to perform an access operation upon the multiple data units at the first plane and the second plane.

According to the embodiments, a method of the above-mentioned flash memory device is disclosed. The method comprises: using the command register to buffer command information sent from the flash memory controller and transmitted through the I/O control circuit; using the address register to buffer address information sent from the flash memory controller and transmitted through the I/O control circuit; using the address control circuit to control the at least address decoder accessing at least one data unit, indicated by the address information transmitted from the address register, for at least one plane of the memory cell array; wherein the address information is first address information which is used for the first plane and is carried by a single command sequence; the step of using the address control circuit comprises: controlling the address control circuit automatically generating second address information associated with the second plane according to the first address information of the first plane, and then selecting multiple data units at the first plane and the second plane based on the first address information and the second address information in response to the command information buffered in the command register so as to perform an access operation upon the multiple data units at the first plane and the second plane.

According to the embodiments, a flash memory controller to be used in a storage device and coupled to a flash memory device of the storage device through a specific communication interface is disclosed. The flash memory controller comprises an input/output (I/O) circuit and a processor. The I/O circuit is coupled to the flash memory device through the specific communication interface, and it is used for sending commands and data between the flash memory device and the processor. The processor is coupled to the I/O circuit, and it is used for sending an access command or an specific indication command through the I/O circuit and the specific communication interface into the flash memory device, to make the flash memory device perform an access operation to control the flash memory device generating second address information associated with a second plane of the flash memory device according to a first address information of a first plane of the flash memory device, and then selecting multiple data units at the first plane and the second plane based on the first address information and the second address information in response to the access command or the specific indication command so as to perform the access operation upon the multiple data units at the first plane and the second plane.

According to the embodiments, a method of a flash memory controller to be used in a storage device and coupled to a flash memory device of the storage device through a specific communication interface is disclosed. The method comprises: providing an input/output (I/O) circuit coupled to the flash memory device through the specific communication interface to send commands and data between the flash memory device and a processor; and, using the processor to send an access command or an specific indication command through the I/O circuit and the specific communication interface into the flash memory device, to make the flash memory device perform an access operation to control the flash memory device generating second address information associated with a second plane of the flash memory device according to a first address information of a first plane of the flash memory device, and then selecting multiple data units at the first plane and the second plane based on the first address information and the second address information in response to the access command or the specific indication command so as to perform the access operation upon the multiple data units at the first plane and the second plane.

According to the embodiments, a flash memory controller to be used in a storage device and coupled to a flash memory device of the storage device through a specific communication interface is disclosed. The flash memory controller comprises an input/output (I/O) circuit and a processor. The I/O circuit is coupled to the flash memory device through the specific communication interface, and it is used for sending commands and data between the flash memory device and the processor. The processor is coupled to the I/O circuit, and it is used for controlling the I/O circuit sending a set-feature signal to the flash memory device to enable, disable, or configure an access operation of the flash memory device, to make the flash memory device perform the access operation to control the flash memory device generating second address information associated with a second plane of the flash memory device according to a first address information of a first plane of the flash memory device, and then selecting multiple data units at the first plane and the second plane based on the first address information and the second address information in response to an access command or a specific indication command so as to perform the access operation upon the multiple data units at the first plane and the second plane.

According to the embodiments, a method of a flash memory controller to be used in a storage device and coupled to a flash memory device of the storage device through a specific communication interface is disclosed. The method comprises: providing an input/output (I/O) circuit coupled to the flash memory device through the specific communication interface and used for sending commands and data between the flash memory device and a processor; and, using the processor to control the I/O circuit sending a set-feature signal to the flash memory device to enable, disable, or configure an access operation of the flash memory device, to make the flash memory device perform the access operation to control the flash memory device generating second address information associated with a second plane of the flash memory device according to a first address information of a first plane of the flash memory device, and then selecting multiple data units at the first plane and the second plane based on the first address information and the second address information in response to an access command or a specific indication command so as to perform the access operation upon the multiple data units at the first plane and the second plane.

According to the embodiments, the complexity of the circuit design of the command sequence can be significantly reduced since the sequence of data unit of multiple different planes can be sequentially transmitted from the flash memory device to the flash memory controller based on the scheme of the flash memory device. This also reduces the waiting time period of the command transmission.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing the technical solutions capable of simplifying the number of issued command sequences to use a single command sequence to achieve the purposes of multiple command sequences for the communication between a flash memory device and a flash memory controller 105 and also for all possible access/processing operations such as a data read operation, a copy back read operation, an erase operation, and a write/program operation under different write modes such as SLC (Single-Level Cell) mode, MLC (Multi-Level Cell) mode, TLC (Triple-Level Cell) mode, QLC (Quad-Level Cell) modes, and so on. A simplified command sequence for example comprises a starting command, intermediate information, and an ending command such as a confirm command, and the confirm command means that the flash memory device can start to execute or perform a corresponding operation associated of the simplified command sequence. It should be noted that the function of the simplified command sequence is different from that of a conventional command sequence since the simplified command sequence is used to access (e.g. read, write/program, or erase) data unit(s) for multiple planes or all planes while a conventional command sequence merely access data of one only one plane; the data unit(s) may mean block/page/sector unit(s) or other data unit(s) defined by a different data size/amount.

Figure 1:
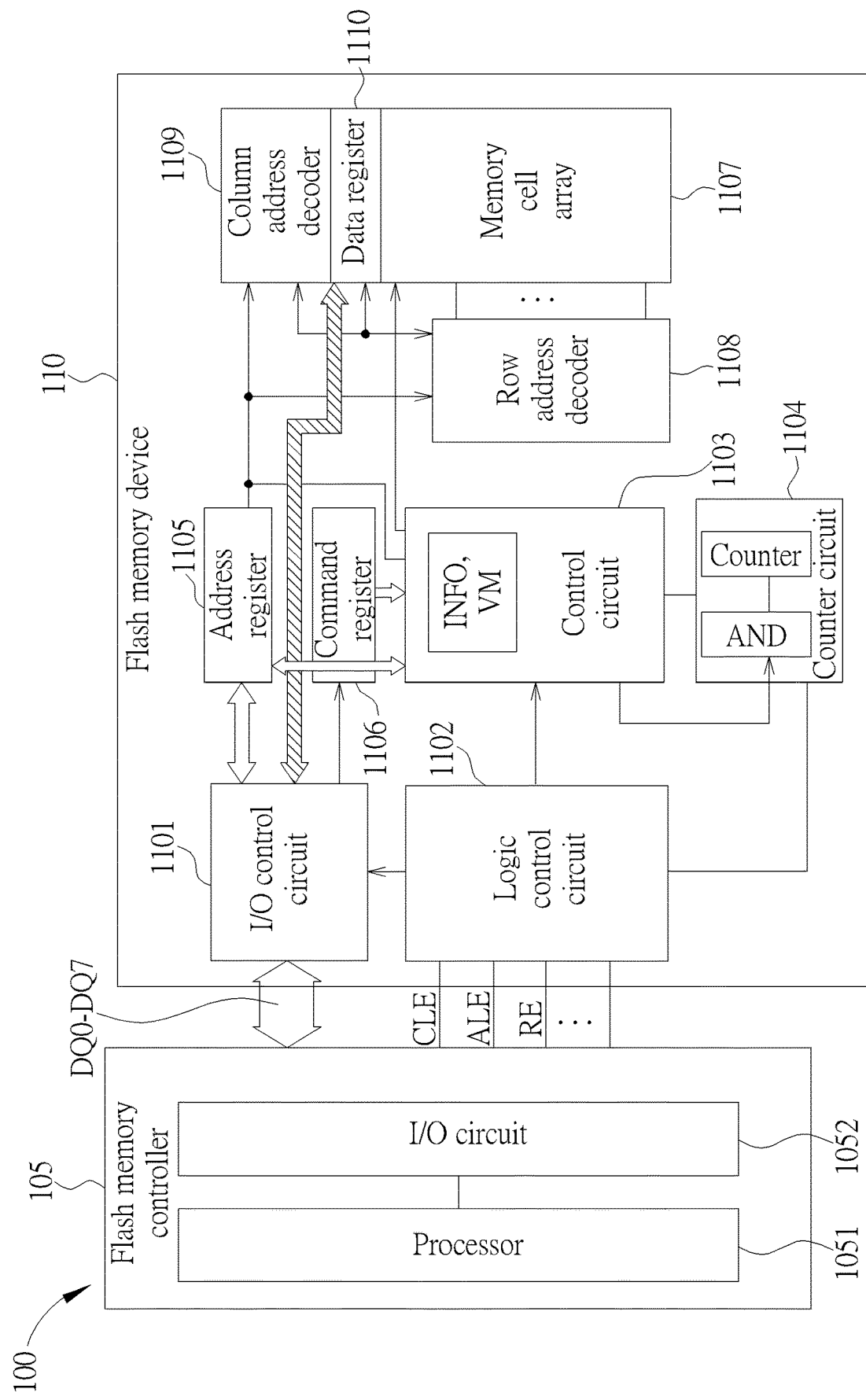
FIG. 1 is a block diagram of a storage device according to an embodiment of the invention.

FIG. 1 is a block diagram of a storage device 100 according to an embodiment of the invention. The storage device 100 for example is a flash memory storage device (but not limited) and comprises a memory controller such as a flash memory controller 105 and a memory device such as a flash memory device 110 having multiple flash memory chips/dies, each flash memory chip/die may comprise one or more different flash memory planes such as four planes. However, the number of planes can be different in different products of the storage device 100, and this is not meant to be a limitation.

The flash memory controller 105 at least comprises a processor 1051 and an input/output (I/O) circuit 1052. The processor 1051 is coupled to the I/O circuit 1052 and is arranged to control the I/O circuit 1052 sending access (e.g. read, write, or erase) commands through a specific communication interface to the flash memory device 110 to control and access the flash memory device 110. The flash memory device 110 comprises an I/O control circuit 1101, a logic control circuit 1102, a control circuit 1103, a counter circuit 1104, an address register 1105, a command register 1106, a memory cell array 1107, a row address decoder 1108, a column address decoder 1109, and a data register 1110. It should be noted that in different embodiments address data/information included in a command sequence transmitted from the flash memory controller 105 to the flash memory device 110 may be formed by only block address information, a combination of page address information and block address information or may be formed by a combination of page address information, block address information, and plane address information for the different processing operations. The plane address information is optional. A block/page/plane address information for example is indicated by using a serial number or an index number which may be in a range from zero to a maximum number. The maximum numbers for block/page/plane addresses are different. For instance, the flash memory controller 105 sends a write command, data to be written, and address information comprising a specific page address, a specific block address, and a specific plane address, and the flash memory device 110 after receiving such communication signals can correspondingly to write data into a page unit corresponding to the specific page address, specific block address, and specific plane address. The erase and read operations are similar.

The flash memory controller 105 is coupled to the flash memory device 110 through the specific communication interface and controls or accesses the flash memory device 110 by sending one or more commands into the flash memory device 110. The specific communication interface for example comprises at least signal ports/pins such as data pins DQ0-DQ7 or other data pins (not shown in FIG. 1), and logic control pins such as CLE (Command Latch Enable), ALE (Address Latch Enable), RE (Read Enable), and other logical control pins. The data pins are coupled to the I/O control circuit 1101, and the logic control pins are coupled to the logic control circuit 1102.

The memory cell array 1107 has two or more planes, and for example at least has a first plane and a second plane to respectively store a first block data or page data corresponding to the first plane and a second block data or page data corresponding to the second plane different from the first plane. To obtain the block data or page data of one or more planes, which is stored in pages of the memory cell array 1107, the processor 1051 of the flash memory controller 105 sends a data read command or a data toggle command to the flash memory device 110 to control the memory cell array 1107 outputting the block data or page data from the pages into to the data register 1110, and it then controls the data register 1110 outputting the block data or page data to the I/O control circuit 1101, so that the I/O control circuit 1101 can transmit the block data or page data to the flash memory controller 105 through the pins DQ0-DQ7 of the specific communication interface. It should be noted that the selection of the data read command or data toggle command can be predetermined or pre-negotiated by the flash memory controller 105 and the flash memory device 110.

Figure 2:
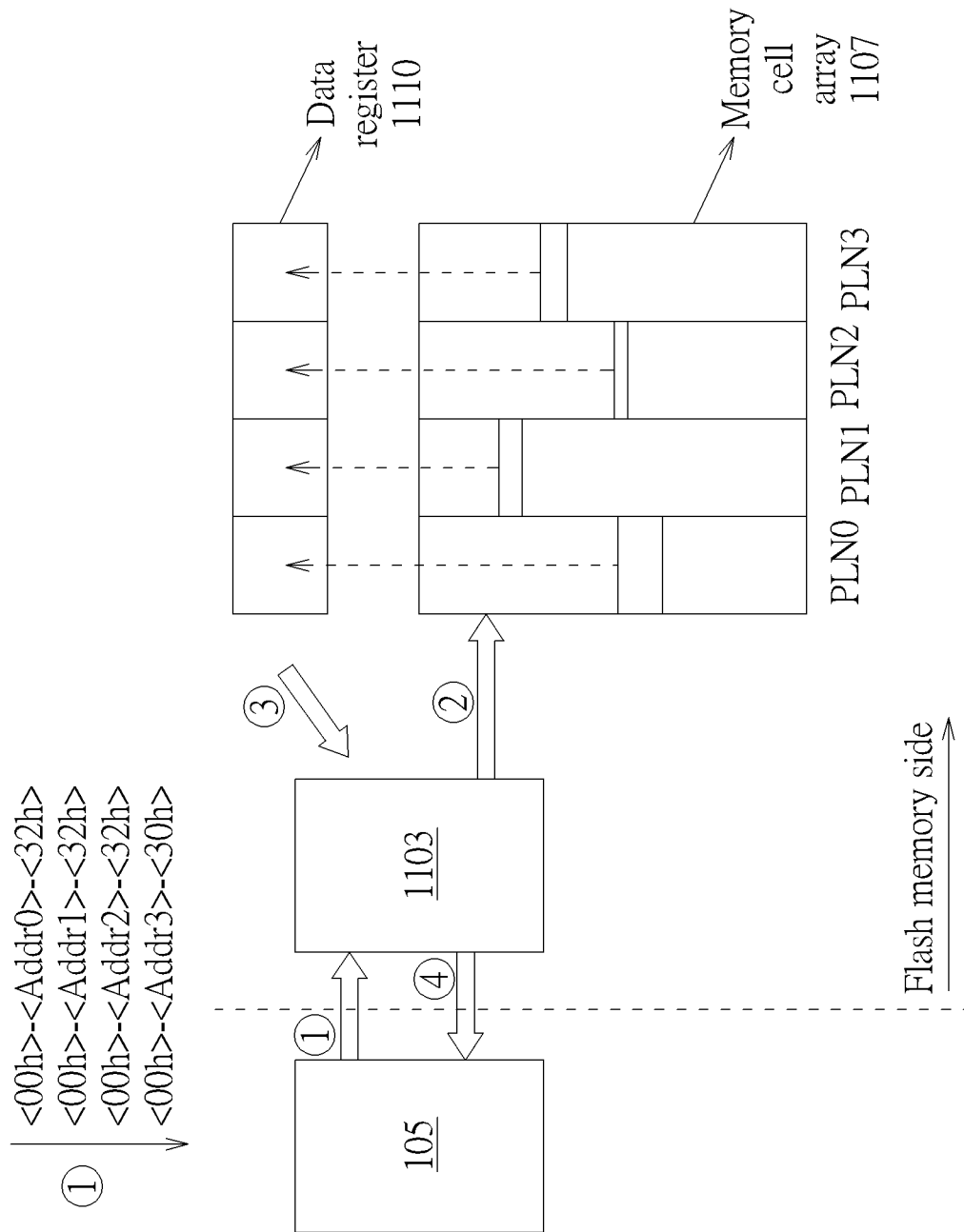
FIG. 2 is a diagram showing an example of the flash memory controller sequentially issuing and sending commands to the flash memory device to control the memory cell array outputting the data unit into the data register according to an embodiment of the invention.

FIG. 2 is a diagram showing an example of the flash memory controller 105 sequentially issuing and sending commands to the flash memory device 110 to control the memory cell array 1107 outputting the block data or page data to the data register 1110 with the flash memory device 110 according to an embodiment of the invention. As shown FIG. 2, in the example (but not limited), the flash memory device 110 comprises four different planes PLN0, PLN1, PLN2, and PLN3. The data register 1110 may allocate corresponding buffers such as four buffers which will be used for respectively storing block data or page data of different planes PLN0, PLN1, PLN2, and PLN3; each allocated buffer can be used to buffer a corresponding block data or page data of a specific plane when a corresponding data read command or a corresponding data toggle command is received and stored by the command register 1106. It should be noted that the data sizes/amounts of the block data or page data for the different planes may be identical or different.

To read out the block data or page data of a particular plane from the flash memory device 110, the flash memory controller 105 (or the processor 1051 controls the I/O circuit 1052) in a first sub-step as shown in FIG. 2 sequentially issues and sends four command sequences each comprising a read mode command (or page read command) such as 00h (the tailing 'h' means hexadecimal), block addresses and page addresses of the block data or page data of the particular plane (e.g. Addr0, Addr1, Addr2, or Addr3 of the planes PLN0, PLN1, PLN2, and PLN3), and a program load command such as multi-plane command 32h (but not limited) or a confirm command such as a read second cycle command 30h (but not limited) to the flash memory device 110 through the specific communication interface by using the pins DQ0-DQ7, ALE, and CLE, RE, and other pin(s).

For instance, in the first sub-step of FIG. 2, the flash memory controller 105 sequentially issues and sends the read mode command 00h, address Addr0, and multi-plane command 32h, issues and sends the read mode command 00h, address Addr1, and multi-plane command 32h, issues and sends the read mode command 00h, address Addr2, and multi-plane command 32h, and then issues and sends the read mode command 00h, address Addr3, and the confirm command 30h (but not limited). For example, in this embodiment, when receiving the confirm command 30h, the control circuit 1103 of the flash memory device 110 can know and confirm that the first sub-step is finished.

In practice, when the flash memory controller 105 sends command data of the read mode command or program load command, the flash memory controller 105 controls the signal of the pin ALE at a low level and controls the signal of the pin CLE at a high level so that the flash memory device 110 can know that the data received via the pins DQ0-DQ7 is command data and then can store the received command data into the command register of FIG. 1. Similarly, when the flash memory controller 105 sends address data of one or more planes, the flash memory controller 105 controls the signal of the pin ALE at the high level and controls the signal of the pin CLE at the low level so that the flash memory device 110 can know that the data received via the pins DQ0-DQ7 is address data and then can store the received address data into the address register of FIG. 1. The operations associated with the pin RE and/or other pin WE (not shown in FIG. 1) are not detailed for brevity.

In a second sub-step of FIG. 2, the control circuit 1103 of the flash memory device 110 is arranged to control the row address decoder 1108 and the column address decoder 1109 to control the memory cell array 1107 outputting corresponding block data or page data to the data register 1110 based on the received address(es) buffered by the address register 1105 and the received command(s) buffered by the command register 1106, so that the corresponding block data or page data of the different planes PLN0, PLN1, PLN2, and PLN3 can be transmitted from the memory cell array 1107 to and buffered in the buffers of the data register 1110.

In one embodiment, when the block data or page data is buffered in the data register 1110, the flash memory controller 105 can issue and send a specific indication command (e.g. a specific data read command or a data toggle command) to the flash memory device 110, and then in a third sub-step of FIG. 2 the control circuit 1103 can obtain and move the corresponding block data or page data from the data register 1110 to the I/O control circuit 1101 of FIG. 1 so that the I/O control circuit 1101 in a fourth sub-step can perform a data toggle operation to control the data register 1110 selecting and transferring the different block data or page data to the I/O control circuit 1101 to make the I/O control circuit 1101 sequentially transmit the selected different block data or page data to the flash memory controller 105 through the specific communication interface in response to the specific data read command or the data toggle command, so as to return or output the corresponding block data or page data from the flash memory device 110 to the flash memory controller 105. For instance, the transmission of one block data or page data of a plane can be followed by the transmission of another block data or page data of a different plane.

In this embodiment, the data toggle command may be determined and selected among multiple reserved commands, and for example is can be configured to be different from a standard command (or a vendor specific command) and may be implemented by using a reserved command such as 0Bh, 12h, 14h, 18h, 1Bh-1Ch, 62h-64h, AAh, 76h, 82h-83h, 86h, and 8Eh wherein 'h' means hexadecimal. The following table shows the different examples of the reserved commands which can be used to implement the data toggle command:

| Type | Opcode |
| --- | --- |
| Standard Command Set | 00h, 05h-06h, 10h-11h, 15h, 30h-32h, 35h, 3Fh, 60h, 70h, 78h, 80h-81h, 85h, 90h, D0h-D1h, D4h-D5h, D9h, E0h-E2h, ECh-EFh, F1h-F2h, F9h, FAh, FCh, FFh |
| Vendor Specific | 01h-04h, 07h-0Ah, 0Ch-0Fh, 13h, 16h-17h, 19h-1Ah, 1Dh-2Fh, 33h-34h, 36h-3Eh, 40h-5Fh, 61h, 65h-6Fh, 71h-75h, 77h, 79h-7Fh, 84h, 87h-8Dh, 8Fh, 91h-CFh, D2h-D3h, D6h-D8h, DAh-DFh, E3h-E8h, F0h, F3h-F8h, FBh, FD-FEh |
| Reserved | 0Bh, 12h, 14h, 18h, 1Bh-1Ch, 62h-64h, 76h, 82h-83h, B6h, 8Eh |

As shown in FIG. 1, the flash memory device 110 provides the data toggle operation/function and can perform the data toggle operation to output and transmit the corresponding block data or page data of one or more selected planes stored in the data register 1110. In practice, after the corresponding block data or page data of the different planes PLN0, PLN1, PLN2, and PLN3 has been transmitted from the memory cell array 1107 to the data register 1110 and stored in the data register 1110, the control circuit 1103 of the flash memory device 110 can control the address register 1105 to make corresponding block data or page data stored in the data register 1110 be transmitted to the I/O control circuit 1101 and then outputted to the flash memory controller 105 in response to the requirement of the flash memory controller 105 according to the bit map information INFO and a mask value VM which are stored in the control circuit 1103.

The bit map information INFO and the mask value VM can be predetermined by the processor 1051 of the flash memory controller 105. The bit map information INFO (or regarded as plane bit map information) may comprise multiple bits, and each bit corresponds to a specific plane and is used to indicate whether a block data or page data of such specific plane is transmitted when the data toggle operation is executed or performed. The number of the multiple bits, i.e. the number of the sequence of bits, is identical to the number of planes. The mask value VM is used to indicate the number (i.e. maximum) of bits/bytes of each block data or page data, and it may be different in each product/implementation of the flash memory device 110. The bit map information INFO and the mask value VM can be determined by the processor 1051 of the flash memory controller 105 when the flash memory device 110 is supplied with power before the specific data read command or the data toggle command is received by the flash memory device 110.

Figure 3:
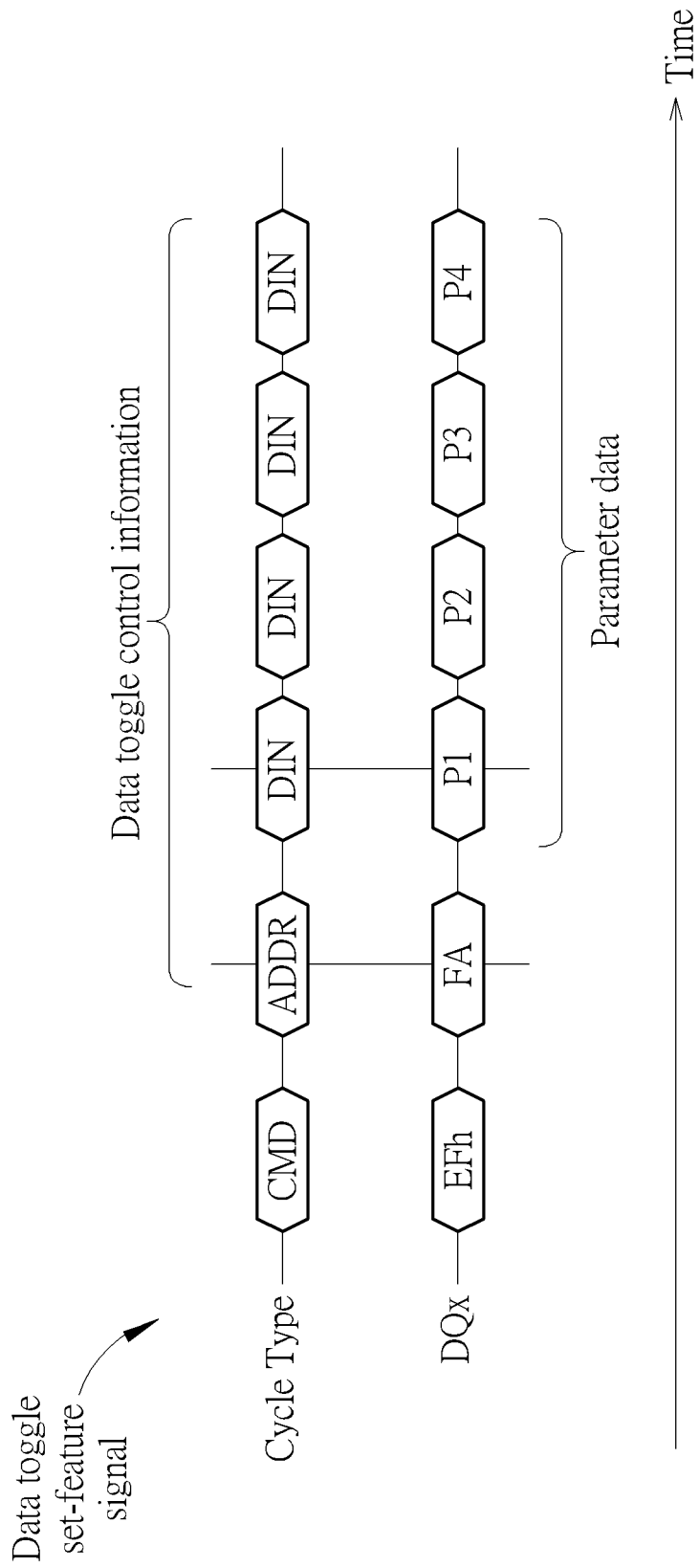
FIG. 3 is a timing diagram showing an example of the flash memory controller sending a data toggle set-feature signal to the flash memory device to configure/set the parameter(s) of the data toggle operation/operation of the flash memory device according to an embodiment of the invention.

The parameter(s) of the data toggle operation can be predetermined by the processor 1051 of the flash memory controller 105. FIG. 3 is a timing diagram showing an example of the flash memory controller 105 sending a data toggle set-feature signal to the flash memory device 110 to configure/set the feature information or parameter(s) of the data toggle operation of the flash memory device 110 according to an embodiment of the invention. As shown in FIG. 3, when the flash memory controller 105 or flash memory device 110 is supplied with power (or it is powered on), the processor 1051 of the flash memory controller 105 can control the I/O circuit 1052 sending a data toggle set-feature signal to the flash memory device 110 to enable or disable the data toggle operation of the flash memory device 110 or configure one or more parameters of the data toggle operation. For example, the data toggle set-feature signal may comprise a set-feature command (cycle type indicated by CMD) such as EFh (but not limited) and a data toggle control information which follows the set-feature command EFh. The data toggle control information is associated with transmissions of different planes of the flash memory device 110, and it for example comprises a feature information FA (cycle type indicated by ADDR) and/or one or more parameter data P1, P2, P3, and P4 (cycle type indicated by DIN) to the flash memory device 110; and one parameter data can be implemented using one or more bits or using one byte or more bytes if the number of totally used parameter data is less than four. The total data length of all parameter data can be configured to meet or match the requirements specified in the standards of flash memory controller/device products; for example (but not limited), the total data length can be configured as four bytes. The number of parameter data is not intended to be a limitation. For setting the features or parameters of the data toggle operation, the content of feature information FA is determined to be associated with the data toggle operation, and thus when receiving such feature information FA the flash memory device can know that the following parameter data are used for setting the data toggle operation.

In one embodiment, the feature information FA can be used to specify or define the different feature operations/functions to be configured or specify the page addresses of the block data or page data of the different planes to be read out by the data toggle operation. Equivalently, the feature information FA comprises a plurality of toggle parameters respectively corresponding to the different planes of the flash memory device 110; for example, a first toggle parameter of a first plane may be different from a second toggle parameter of a second plane. In addition, in other embodiment, the feature information FA can carry the above-mentioned bit map information INFO and/or mask value VM per die/chip, which are determined or dynamically adjusted by the processor 1051 and then transmitted to the flash memory device 110. Different mask values VM can be configured by using the feature information FA. The examples of its corresponding information and descriptions of the feature information FA can be indicated by the following table:

| Feature | Description |
| --- | --- |
| 00h | Reserved |
| 01h | Timing Mode |
| 02h | NV-DDR2/NV-DDR3/NV-LPDDR4 Configuration |
| 03h-0Fh | Reserved |
| 10h | I/O Drive Strength |
| 11h-1Fh | Reserved |
| 20h | DCC, Read, Write Tx Training |
| 21h | Write Training RX |
| 22h | Channel ODT configuration for NV-LPDDR4 |
| 23h | Internal VrefQ value |
| 24h-2Fh | Reserved |
| 30h | External Vpp Configuration |
| 31h-4Fh | Reserved |
| 50h | Reserved |
| 51h-57h | Reserved |
| 58h | Volume Configuration |
| 59h-5Fh | Reserved |
| 60h | Reserved |
| 61h | Reserved |
| 62h-7Fh | Vendor specific |
| 80h-FFh | Vendor specific |

For example, the reserved examples, e.g. 00h, 03h-0Fh, 11h-1Fh, 24h-2Fh, or other reserved addresses, can be used to implement the feature information FA.

The parameter data P1 of the data toggle set-feature signal is used to indicate whether to enable or disable the data toggle operation. When the parameter data P1 is set as a first logic bit such as '1', the data toggle operation, to be performed by the flash memory device 110, can be enabled and configured as a sequential data read mode which will be arranged to sequentially transmit block data or page data of all the different planes from the flash memory device 110 to the flash memory controller 105 according to serial numbers of the different planes in response to requested address data included in a data read command (or a data toggle command) sent from the flash memory controller 105. When the parameter data P1 is set as a second logic bit such as '0', the data toggle operation of the flash memory device 110 is disabled. In this situation, the execution of the data toggle operation is stopped, and the flash memory controller 105 needs to send a data read command to the flash memory device 110 each time when it wants to receive the block data or page data of one plane.

The parameter data P2 of the data toggle set-feature signal is used to indicate whether the data toggle operation enters an enhance mode. When the parameter data P2 is set as a first logic bit '1', the data toggle operation, to be performed by the flash memory device 110, is configured as the enhance mode (i.e. a partial selecting mode) which is arranged to transmit a portion of block data or page data of a portion of the different planes from the flash memory device to the flash memory controller 105 according to the bit map information INFO. That is, when the parameter data P1 indicates '1' and the parameter data P2 indicates '1', the control circuit 1103 of flash memory device 110 is arranged to select and transmit the block data or page data corresponding to specific block/page address of one or more planes based on the information of bit map information INFO. For example, a block data or page data corresponding to specific block/page address of a particular plane may be not selected and transmitted by the data toggle operation, and the serial number of the particular plane may be positioned between serial numbers of two different planes which is to be serviced by the data toggle operation from the flash memory device 110 to the flash memory controller 105. Alternatively, when the parameter data P1 indicates '1' and the parameter data P2 indicates '0', sent from the flash memory controller 105, the control circuit 1103 may transmit the block data or page data corresponding to specific block/page address of all planes.

The parameter data P3 of the data toggle set-feature signal is used to indicate whether the data toggle operation can be performed in response to a data read command or in response to a data toggle command. When the parameter data P3 is set as a first logic bit '1', the data toggle operation, to be performed by the flash memory device 110, is configured to transmit block data or page data in response to a data toggle command such as 0xAA sent from the flash memory controller 105. Alternatively, when the parameter data P3 is set as a second logic bit '0', the data toggle operation, to be performed by the flash memory device 110, can be configured to transmit block data or page data in response to a specific data read command such as 0x05 or 0x06 sent from the flash memory controller 105.

The parameter data P4 of the data toggle set-feature signal is used to indicate whether the data toggle operation uses a preset mask value stored by the flash memory device 110 or uses an updated mask value sent from the flash memory controller 105 as the mask value VM to transmit block data or page data corresponding to specific block/page address for one or more planes. When the parameter data P4 is set as a first logic bit '1', the data toggle operation, to be performed by the flash memory device 110, is configured to transmit block data or page data in response to a data read command (or a data toggle command) according to the preset mask value stored by the flash memory device 110. Alternatively, when the parameter data P4 is set as a second logic bit '0', the data toggle operation, to be performed by the flash memory device 110, is configured to transmit block data or page data in response to a data read command (or a data toggle command) sent from the flash memory controller 105 according to the updated mask value sent from the flash memory controller 105.

Additionally, in other embodiment, the data toggle control information may further comprise a parameter data P5 (not shown in FIG. 3). The parameter data P5 of the data toggle set-feature signal is used to indicate whether the data toggle operation uses the updated bit map information sent from the flash memory controller 105 or automatically calculates and obtains the bit map information by itself for the different planes. When the parameter data P5 is set as a first logic bit '1', the data toggle operation, to be performed by the flash memory device 110, is configured to transmit block data or page data in response to a data read command (or a data toggle command) sent from the flash memory controller 105 according to a bit map information which is automatically calculated and stored by the flash memory device 110. Alternatively, when the parameter data P5 is set as a second logic bit '0', the data toggle operation, to be performed by the flash memory device 110, is configured to transmit block data or page data in response to a data read command (or a data toggle command) sent from the flash memory controller 105 according to a bit map information which is updated by the flash memory controller 105.

It should be noted that the bit map information, sent from the flash memory controller 105 to the flash memory device 110, can be transmitted by using the feature information FA or by using another toggle control information sent from the flash memory controller 105 wherein the transmission of the another toggle control information may follow the transmission of a data read command (or a data toggle command) which will be described later. That is, based on the dynamically updated bit map information, the processor 1051 of flash memory controller 105 can real-timely determine whether to ignore the block data or page data corresponding to specific block/page address of a particular plane and notifies the flash memory device 110 of further transmitting the block data or page data corresponding to specific block/page address of a specific plane which is not asked last time. For instance, originally the bit map information may indicate that the block data or page data corresponding to specific block/page address of all planes are transmitted by the data toggle operation, and the updated bit map information can indicate that the data toggle operation does not need to transmit the block data or page data corresponding to specific block/page address of a particular plane.

Figure 4:
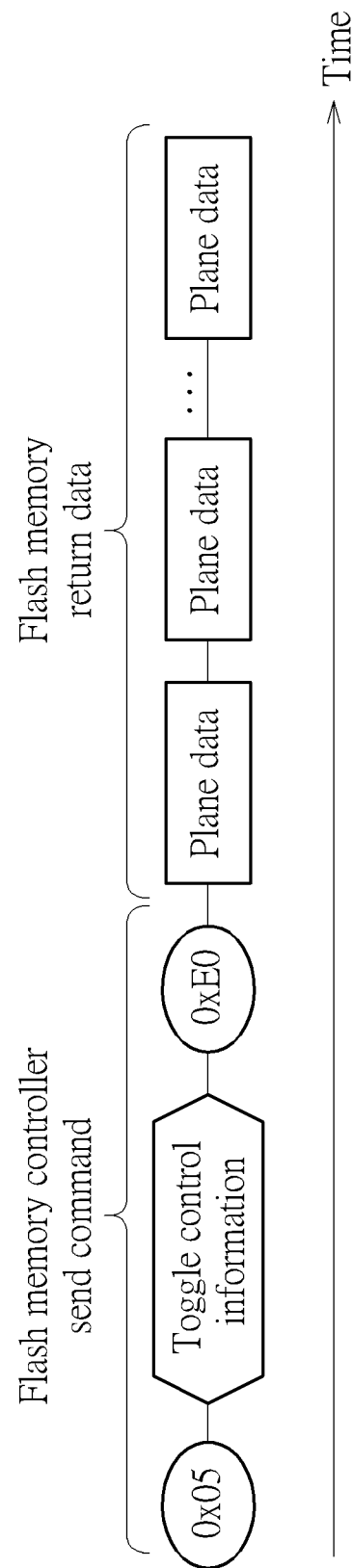
FIG. 4 is a timing diagram showing the example of the communication of the data toggle operation between the flash memory controller and the flash memory device according to an embodiment of the invention.

FIG. 4 is a timing diagram showing the example of the communication of the data toggle operation between the flash memory controller 105 and the flash memory device 110 according to an embodiment of the invention. As shown in FIG. 4, the processor 1051 of the flash memory controller 105 controls the I/O circuit 1052 sequentially sending a specific data read command (or page read command) such as 0x05 (i.e. 05h) or 0x06 (i.e. 06h), toggle control information, and a change read command (or change read column command) such as 0xE0 (i.e. E0h) to the flash memory device 110; hexadecimal numbers can be written with and indicated by a leading "0x" or a trailing "h". When receiving the data read command 0x05 and the data toggle operation has been enabled by the data toggle set-feature signal mentioned above, the flash memory device 110 or control circuit 1103 can know that the information following the command 0x05, i.e. the toggle control information, is used to configure the parameters of data toggle operation wherein the data amounts of the toggle control information for example may be two bytes (but not limited). Then, once receiving the command 0xE0, the flash memory device 110 or control circuit 1103 can know and confirm that the reception of toggle control information has been finished and it can start to execute the data toggle operation.

The toggle control information may comprise block and page addresses (such as multiple-cycle addresses) of one or more planes, and the toggle control information can be used to specify which one or more block data or page data is to be returned. Then, the flash memory device 110 transmits the block data or page data, to be returned, from the data register 1110 to the I/O control circuit 1101, and then the I/O control circuit 1101 can transmit the block data or page data, to be returned, to the flash memory controller 105 through the pins DQ0-DQ7. For example, a transmission of the change read command 0xE0 is followed by a transmission of a first block data or page data (i.e. first data unit corresponding to a first plane), which is followed by a transmission of a second block data or page data (i.e. second data unit corresponding to a second plane), and the first block data or page data and the second block data or page data are respectively associated with different planes of the flash memory device 110.

In practice, the control circuit 1103 stores the bit map information predetermined by the flash memory controller 105, and it refers to the bit map information to determine which one or more block data or page data should be transferred and moved from the data register 1110 to the I/O control circuit 1101. The counter circuit 1104 for example comprises an AND gate logic circuit (indicated by "AND") and a counter which is used to run and count initially from zero to a specific value determined by the control circuit 1103. The determined specific value may be equal to the mask value VM corresponding to the total byte number of a specific data amount such as one page data amount, and it for example (but not limited) is equal to 16384, i.e. 16×1024, if the mask value VM is associated with one page data amount of 16K bytes. Each time when the flash memory controller 105 changes/alters the signal level at the RE pin (i.e. read enable pin), the logic control circuit 1102 is arranged to transmit a trigger signal to notify the counter circuit 1104, and the counter circuit 1104 increments its counter value by one and then compares the counter value with the determined specific value such as the mask value VM each time when receiving the trigger signal; that is, the counter value of the counter is incremented by one. When the counter value becomes equal to the mask value VM, the counter circuit 1104 sends an interrupt signal to the control circuit 1103 to make the control circuit 1103 select and switch to another plane (i.e. a next plane) and then transmit another block data or page data from the data register 1110 to the I/O control circuit 1101 if it is needed, so as to transmit a second block data or page data from the I/O control circuit 1101 to the flash memory controller 105 through the specific communication interface after the transmission of a first block data or page data is finished.

In practice, in one embodiment, the counter for example is used for counting and incrementing the counter value by one in response to the trigger signal transmitted from the logic control circuit 1102, and for outputting the incremented counter value to the AND gate logic circuit. The AND gate logic circuit is coupled to the counter and has a first input, a second input, and an output. The first input is coupled to the mask value VM (e.g. 16384 for one page having 16K bytes) determined by the control circuit 1103, and the second input is coupled to an output of the counter to receive the counter value. The AND gate logic circuit performs an AND logic operation upon the counter value and the mask value VM and generates the interrupt signal to the control circuit 1103 only when the incremented counter value is equal to the mask value VM. When the interrupt signal is sent, the counter value is reset as zero. The circuit structure of AND gate logic circuit is not intended to be a limitation of the invention.

In other embodiment, the initial counter value of the counter circuit 1104 may be set by the control circuit 1103 as the mask value, and the counter is arranged to count down to zero and the AND gate logic circuit performs the AND logic operation upon the decremented counter value and zero. The AND gate logic circuit generates the interrupt signal to the control circuit 1103 only when the decremented counter value is equal to zero. Thus, the control circuit 1103 can know and confirm that now the counting data amount is equal to a specific data amount such as one page data or one block data when receiving such interrupt signal, and then the control circuit 1103 can control the address register 1105 and the data register 1110 to select and switch to a next plane and transmit a next block data or page data of the next plane to the I/O control circuit 1101 if it is needed and also simultaneously reset the counter.

For example (but not limited), the bit map information INFO may record four bits to respectively indicate whether the data of four planes PLN0-PLN3 should be transmitted or not. For example (but not limited), if the four bits is '1101', then this indicates that the block data or page data corresponding to specific block/page address of the planes PLN0, PLN2, and PLN3 should be transmitted while the block data or page data corresponding to specific block/page address of the plane PLN1 is not transmitted. That is, the serial number of the plane PLN1 is between the serial number of the plane PLN0 and the serial number of the plane PLN2, and the block data or page data corresponding to specific block/page address of the plane PLN1 is not transmitted from the data register 1110 into the I/O control circuit 1101 in response to the bit map information INFO determined by the flash memory controller 105. Thus, when the control circuit 1103 receives the interrupt signal for the first time, the control circuit 1103 can know and confirm that the transmission of the data amount of the current plane is finished, and it refers to the bit map information INFO and then can know the next block data or page data to be transmitted is the data corresponding to specific block/page address of plane PLN2 since the bit map information INFO indicates that the data of plane PLN1 is not transmitted.

Similarly, when the control circuit 1103 receives the interrupt signal for the second time, the control circuit 1103 can know and confirm that the transmission of the data amount of the current plane is finished, and it refers to the bit map information INFO and then can know and confirm the next block data or page data to be transmitted is the data corresponding to specific block/page address of plane PLN3 since the bit map information INFO indicates that the current plane is plane PLN2.

Similarly, when the control circuit 1103 receives the interrupt signal for the third time, the control circuit 1103 can know that the transmission of the data amount of the current plane is finished, and it refers to the bit map information INFO and then can know that the current plane PLN3 is the last plane and stops the data transmission from the data register 1110 to the I/O control circuit 1101. Thus, by using the mask value VM, the operation of counter circuit 1104, and the bit map information INFO, which is predetermined, the flash memory device 110 can correctly return which one or more block data or page data that is asked by the flash memory controller 105. Accordingly, as shown in FIG. 4, after receiving the confirm command 0xE0, the flash memory device 110 can correctly return or transmit one or more block data or page data that is asked by the flash memory controller 105. In this example, the block data or page data of planes PLN0, PLN2, and PLN3 are sequentially transmitted from the flash memory device 110 to the flash memory controller 105 wherein the data transmission of plane PLN3 follows the data transmission of plane PLN2 which follows the data transmission of plane PLN0.

It should be noted that, in the embodiment of FIG. 4, the mask value VM can be different in response to the plane requirements of a flash memory manufacturer and can be predetermined by using the two parameter data P2 and P3 such as two bytes included within the data toggle set-feature signal mentioned above. That is, when the flash memory device 110 is supplied with power, the mask value VM can be configured by using the data toggle set-feature signal.

In addition, the mask value VM can be dynamically adjusted by the processor 1051 of the flash memory controller 105 respectively for the different planes.

Also, the data toggle operation of the flash memory device 110 can be enabled by using the bit of parameter data P1 in the data toggle set-feature signal sent from the flash memory controller 105 when the flash memory device 110 is supplied with power, so that multiple corresponding block data or page data corresponding to specific block/page address of the different planes can be directly and sequentially retuned from the flash memory device 110 to the flash memory controller 105 based on a single one data read command (e.g. 0x05 or 0x06) sent from the flash memory controller 105.

It should be noted that, in other embodiment, the flash memory controller 105 may ask the flash memory device 110 return the data corresponding to specific block/page address of all planes PLN0-PLN3, the bit map information INFO may record '1111' that is predetermined by the flash memory controller 105, and the control circuit 1103 in FIG. 1 is arranged to control the address register 1105 to make the data register 1110 sequentially transmit all the block data or page data corresponding to specific block/page address to the I/O control circuit 1101 so that the I/O control circuit 1101 can sequentially transmit all the block data or page data corresponding to specific block/page address to the flash memory controller 105. That is, once receiving a data read command from the flash memory controller 105, the flash memory device 110 can return one or more corresponding block data or page data, which is asked by the flash memory controller 105, back to the flash memory controller 105 without waiting for another data read command of the flash memory controller 105. The data toggle operation performed by the control circuit 1103 can be used to transmit a sequence of block data or page data associated with different planes of the memory cell array 1107 in response to only one specific data read command or only one data toggle command.

Figure 5:
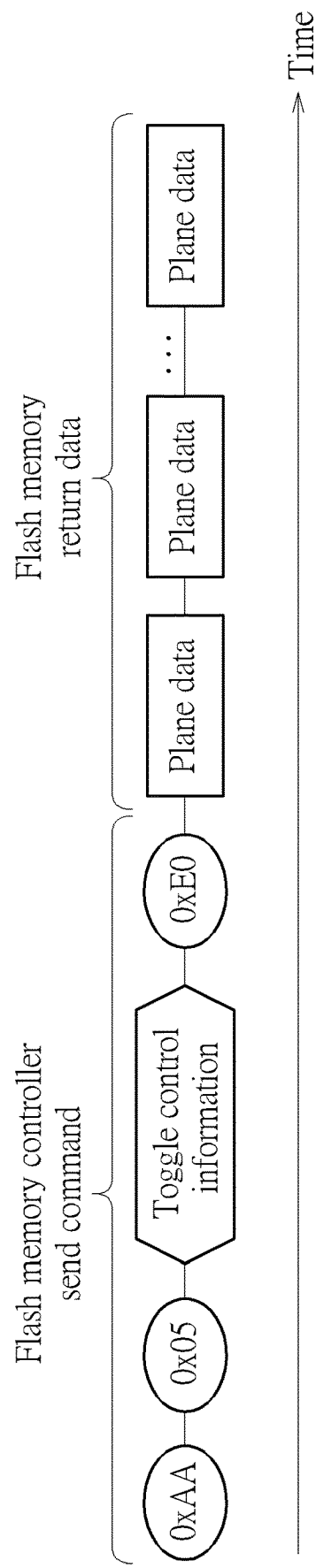
FIG. 5 is a timing diagram of the operation of the flash memory controller sending a data toggle command such as 0xAA (but not limited) to the flash memory device to enable the data toggle operation according to an embodiment of the invention.
Figure 6:
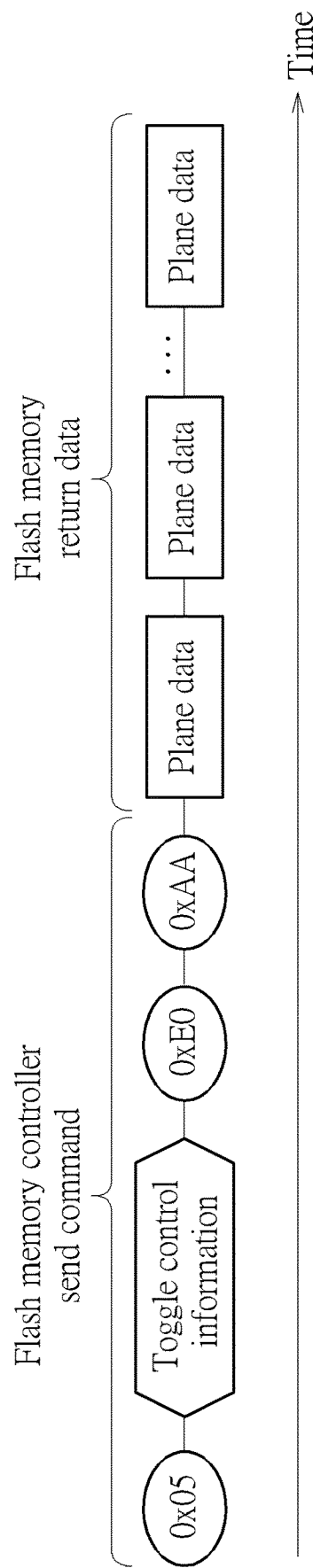
FIG. 6 is a timing diagram of the operation of the flash memory controller sending a data toggle command 0xAA to the flash memory device to enable the data toggle operation according to another embodiment of the invention.

In other embodiments, the data toggle operation can be dynamically enable or disabled if needed. FIG. 5 is a timing diagram of the operation of the flash memory controller 105 sending the data toggle command such as 0xAA (but not limited) to the flash memory device 110 to enable the data toggle operation according to an embodiment of the invention. FIG. 6 is a timing diagram of the operation of the flash memory controller 105 sending the data toggle command such as 0xAA (but not limited) to the flash memory device 110 to enable the data toggle operation according to another embodiment of the invention. As shown in FIG. 5, the processor 1051 controls the I/O circuit 1052 sequentially transmitting the data toggle command such as 0xAA, the specific data read command such as 0x05 or 0x06, toggle control information, and a change read command such as 0xE0 to the flash memory device 110 through the specific communication interface, to make the flash memory device 110 return the block data or page data corresponding to specific block/page address of one or more planes. The toggle control information includes block/page addresses of the planes. For example, in FIG. 5, the data toggle command 0xAA can be configured to be followed by the data read command 0x05 (or 0x06 in other embodiments). The transmission of the change read command 0xE0 is followed by a transmission of a first block data or page data which may be followed by a transmission of a second block data or page data.

As shown in FIG. 6, the data toggle command 0xAA can be configured to follow the command 0xE0. The processor 1051 controls the I/O circuit 1052 sequentially transmitting the data read command 0x05 or 0x06, toggle control information, the change read command 0xE0, and the data toggle command 0xAA to the flash memory device 110 through the specific communication interface, to make the flash memory device 110 return the block data or page data corresponding to specific block/page address of one or more planes. The toggle control information includes page addresses of the planes. When receiving the data toggle command 0xAA, the flash memory device 110 can know and confirm that the data toggle operation or function is enabled, and then it is arranged to transmit one or more corresponding block data or page data to the flash memory controller 105 even though it receive only one data read command 0x05. For example, the transmission of the data toggle command 0xAA is followed by a transmission of a first block data or page data which is followed by a transmission of a second block data or page data.

Figure 7:
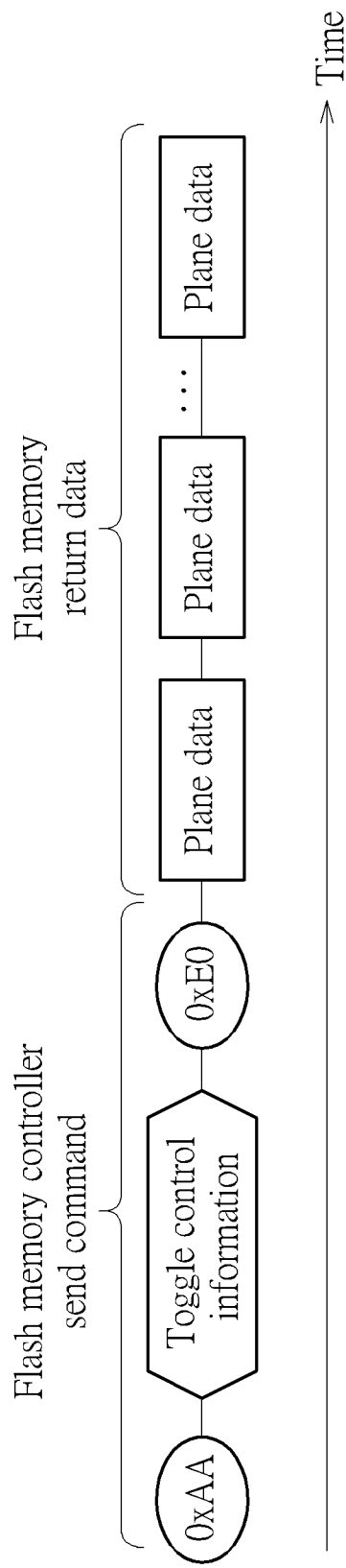
FIG. 7 is a timing diagram of the operation of the flash memory controller sending the data toggle command 0xAA to the flash memory device to enable the data toggle operation without sending the read command 0x05 according to an embodiment of the invention.

In other embodiment, the data toggle command 0xAA mentioned above can be used to replace the data read command 0x05 or replace the confirm command 0xE0. FIG. 7 is a timing diagram of the operation of the flash memory controller 105 sending the data toggle command 0xAA to the flash memory device 110 to enable the data toggle operation without sending the data read command 0x05 according to an embodiment of the invention. As shown in FIG. 7, the data toggle command 0xAA can be configured to replace the function of a data read command 0x05 or 0x06. The processor 1051 controls the I/O circuit 1052 sequentially transmitting the data toggle command 0xAA, toggle control information, and a change read command 0xE0 to the flash memory device 110 through the specific communication interface, to make the flash memory device 110 return the block data or page data corresponding to specific block/page address of one or more planes. The toggle control information includes specific block/page address information of different planes or includes only specific block/page address information of a starting plane. The data toggle command 0xAA is followed by the toggle control information which is followed by the command 0xE0. In FIG. 7, when receiving the data toggle command 0xAA, the flash memory device 110 can know that the data toggle operation or function is enabled and also know that the data toggle command (i.e. 0xAA) is received. For example, the transmission of the change read command 0xE0 (i.e. a confirm command) is followed by a transmission of a first block data or page data at a first plane which is followed by a transmission of a second block data or page data at a second plane.

Figure 8:
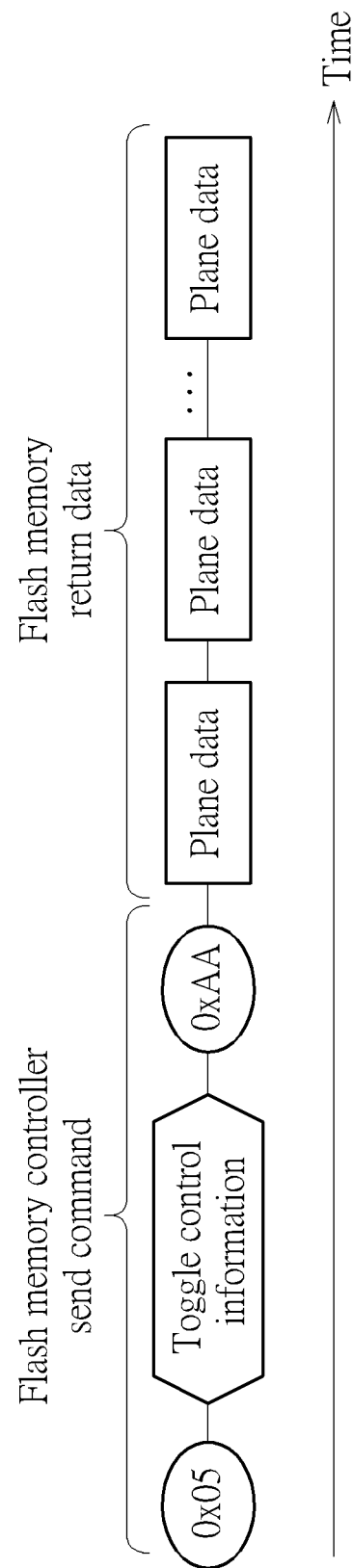
FIG. 8 is a timing diagram of the operation of the flash memory controller sending a data toggle command 0xAA to the flash memory device to enable the data toggle operation without sending the command 0xE0 according to another embodiment of the invention.

FIG. 8 is a timing diagram of the operation of the flash memory controller 105 sending a data toggle command 0xAA to the flash memory device 110 to enable the data toggle operation without sending the command 0xE0 according to another embodiment of the invention. As shown in FIG. 8, the data toggle command 0xAA can be configured to replace the function of a change read command 0xE0 and used as a confirm command. The processor 1051 controls the I/O circuit 1052 sequentially transmitting the specific data read command such as 0x05 or 0x06, toggle control information, and the data toggle command 0xAA to the flash memory device 110 through the specific communication interface, to make the flash memory device 110 return the block data or page data corresponding to block/page address information of one or more planes. The toggle control information includes block/page addresses of the different planes. The data toggle command 0xAA follows the toggle control information which follows the data read command 0x05. In FIG. 8, once receiving the data toggle command 0xAA, the flash memory device 110 can know that the data toggle operation or function is enabled and also now can transmit one or more corresponding block data or page data to the flash memory controller 105 even though it receive only one data read command 0x05. For example, the transmission of the data toggle command 0xAA is followed by a transmission of a first block data or page data at a first plane which is followed by a transmission of a second block data or page data at a second plane.

Figure 9:
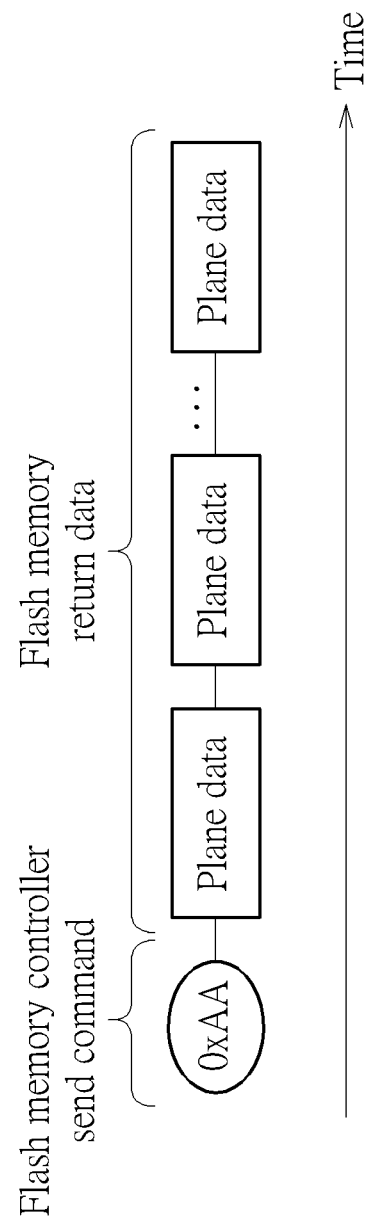
FIG. 9 is a timing diagram of the operation of the flash memory controller sending only the data toggle command 0xAA to the flash memory device to enable the data toggle operation according to an embodiment of the invention.

In other embodiment, the flash memory controller 105 can send only the data toggle command 0xAA to the flash memory device 110 to enable the data toggle operation and sending the data read command without using and sending a data read command 0x05, toggle control information, and command 0xE0. FIG. 9 is a timing diagram of the operation of the flash memory controller 105 sending only the data toggle command 0xAA to the flash memory device 110 to enable the data toggle operation according to an embodiment of the invention. As shown in FIG. 9, the toggle control information can be preset by the flash memory controller 105 when the flash memory device 110 is powered on and supplied with power by using the data toggle set-feature signal mentioned above. The toggle control information can be sent from the flash memory controller 105 to the flash memory device 110 by using the parameters in the data toggle set-feature signal. In this situation, the processor 1051 controls the I/O circuit 1052 transmitting the data toggle command 0xAA to the flash memory device 110 through the specific communication interface, to make the flash memory device 110 return the block data or page data at one or more planes. Alternatively, in other embodiments, the processor 1051 may control the I/O circuit 1052 transmitting only the data toggle command 0xAA to the flash memory device 110 through the specific communication interface, to make the flash memory device 110 return all the block data or page data corresponding to specific block/page address information of all different planes; the specific block/page address information can be set or configured by using a set-feature signal mentioned above. Once receiving the data toggle command 0xAA, the flash memory device 110 can know that a data read command is received, the data toggle operation is enabled, and also now it can start to execute the data toggle operation to return one or more corresponding block data or page data to the flash memory controller 105. For example, a transmission of the data toggle command 0xAA is followed by a transmission of a first block data or page data at a first plane which is followed by a transmission of the second block data or page data at a second plane. If the flash memory controller 105 asks the group of block data or page data, then a transmission of only the data toggle command 0xAA for example is followed by transmissions of the group of block data or page data.

In addition, it should be noted that the transmission of the data toggle command 0xAA in other embodiment can be positioned between the transmission of data read command (e.g. 0x05) and the transmission of toggle control information (i.e. block/page address information). Alternatively, the transmission of the data toggle command 0xAA in other embodiment can be positioned between the transmission of toggle control information and the transmission of command 0xE0. The modifications also fall within the scope of the invention.

In other embodiments, the invention further provides a technical solution capable of simplifying the command sequences, sent from a memory controller (e.g. the flash memory controller 105) to a memory device (e.g. a flash memory device), when the memory controller performs a copy back read operation, a write/program operation, and/or an erase operation. It should be noted that the copy back read operation is arranged to copy some data from the memory cell array 1107 into the data register 1110 within the flash memory device 110, which is different from the data read operation that is arranged to read data sent from the flash memory device 110 to the flash memory controller 105.

More particularly, the provided technical solution can simplify multiple command sequences respectively issued by a conventional method to generate and output a simplified command sequence to the flash memory device so as to significantly reduce the command/address amounts of the communications between the flash memory device and the flash memory controller 105.

Figure 10:
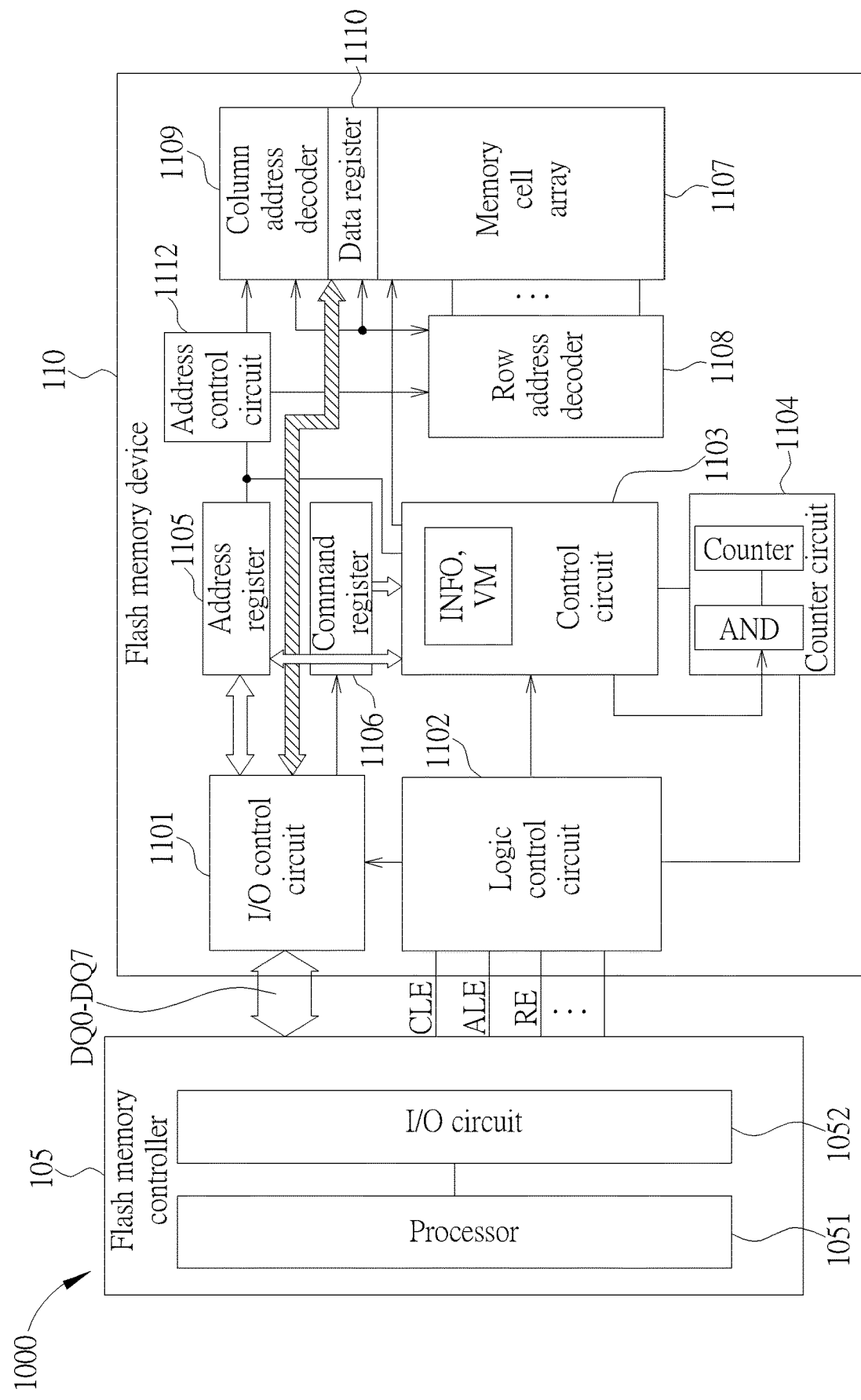
FIG. 10 is a block diagram of a storage device according to another embodiment of the invention.

FIG. 10 is a block diagram of a storage device 1000 according to another embodiment of the invention. The storage device 1000 for example is a flash memory storage device (but not limited) and comprises a memory controller such as the flash memory controller 105 and a memory device such as the flash memory device 110 having multiple flash memory chips/dies, each flash memory chip/die may comprise one or more different planes such as four planes. However, the number of planes can be different in different products of the storage device 1000. The processor 1051 controls the I/O circuit 1052 sending read, write/program, erase commands through the above-mentioned specific communication interface to the flash memory device 110 to control and access the flash memory device 110. The flash memory device 110 comprises the I/O control circuit 1101, logic control circuit 1102, control circuit 1103, counter circuit 1104, address register 1105, command register 1106, memory cell array 1107, row address decoder 1108, column address decoder 1109, data register 1110, and an address control circuit 1112. The operations and functions of the elements having the same reference signs in FIG. 10 are identical or similar to those in FIG. 1, and are not detailed for brevity.

For the operation of address control circuit 1112, the address information for example is first address information which is used for a first plane and is carried by a single command sequence. The address control circuit 1112 is arranged to automatically generate second address information associated with a second plane according to the first address information of the first plane, and then control the address decoder(s) selecting multiple data units at the first plane and the second plane based on the first address information and the second address information in response to the command information buffered in the command register 1106 so as to perform an access operation upon the multiple data units at the first plane and the second plane. The access operation is an erase operation, a write operation, or a copy back read operation.

In one embodiment, the address control circuit 1112 may automatically generate the second address information in response to only the received first address information and control the address decoder(s) transferring the first data unit and the second data unit respectively from the first plane and the second plane to the data register 1110.

Further, the address control circuit 1112 may automatically change the first address information as a third address information, which indicates a third data unit for the first plane, in response to a bit map information or a set-feature signal sent from the flash memory controller 105, and controls the at least one address decoder transferring the third data unit from the first plane to the data register without transmitting the first data unit.

Further, the address control circuit 1112 may automatically change the first address information as a third address information, which indicates a third data unit at a third plane different from the first plane, in response to a bit map information or a set-feature signal sent from the flash memory controller 105, and controls the at least one address decoder transferring the third data unit from the third plane to the data register 1110 without transmitting the first data unit.

Further, in one embodiment, the address control circuit 1112 may automatically generate the second address information in response to only the received first address information and control the at least one address decoder selecting the first data unit and the second data unit respectively at the first plane and the second plane to erase the first data unit and the second data unit.

Further, the address control circuit 1112 may automatically change the first address information as a third address information, which indicates a third data unit for the first plane, in response to a bit map information or a set-feature signal sent from the flash memory controller 105, and controls the at least one address decoder selecting the third data unit at the first plane to erase the third data unit without selecting the first data unit.

Further, the address control circuit 1112 may automatically change the first address information as a third address information, which indicates a third data unit for a third plane, in response to a bit map information or a set-feature signal sent from the flash memory controller 105, and controls the at least one address decoder selecting the third data unit at the third plane to erase the third data unit without selecting the first data unit at the first plane.

Further, the address control circuit 1112 may automatically generate the second address information in response to only the received first address information and control the at least one address decoder selecting the first data unit and the second data unit respectively at the first plane and the second plane to write data into the first data unit and the second data unit.

Further, the address control circuit 1112 may automatically change the first address information as a third address information, which indicates a third data unit for the first plane, in response to a bit map information or a set-feature signal sent from the flash memory controller 105, and controls the at least one address decoder selecting the third data unit at the first plane to write data into the third data unit without selecting the first data unit at the first plane.

Further, the address control circuit 1112 may automatically change the first address information as a third address information, which indicates a third data unit for a third plane different from the first plane, in response to a bit map information or a set-feature signal sent from the flash memory controller 105, and controls the at least one address decoder selecting the third data unit at the third plane to write data into the third data unit without selecting the first data unit at the first plane.

In practice, for a copy back read operation, the processor 1051 of the flash memory controller 105 can send a copy back read command and/or a specific indication command to the flash memory device 110 to make the address control circuit 1112 control the memory cell array 1107 outputting block data or page data from one or more blocks/pages of the different planes to the data register 1110. In response to the event of receiving such copy back read command and/or specific indication command, the address control circuit 1112 can control the row address decoder 1108 and column address decoder 1109 selecting corresponding page address(es), block address(es), and plane address(es) according to address information carried by a command sequence, the default setting, or the configuration dynamically configured by the processor 1051, so as to output the corresponding page data or block data to the data register 1110. It should be noted that the page data may mean one page data unit or more page data units, and the block data may mean one block data unit or more block data units.

Figure 11:
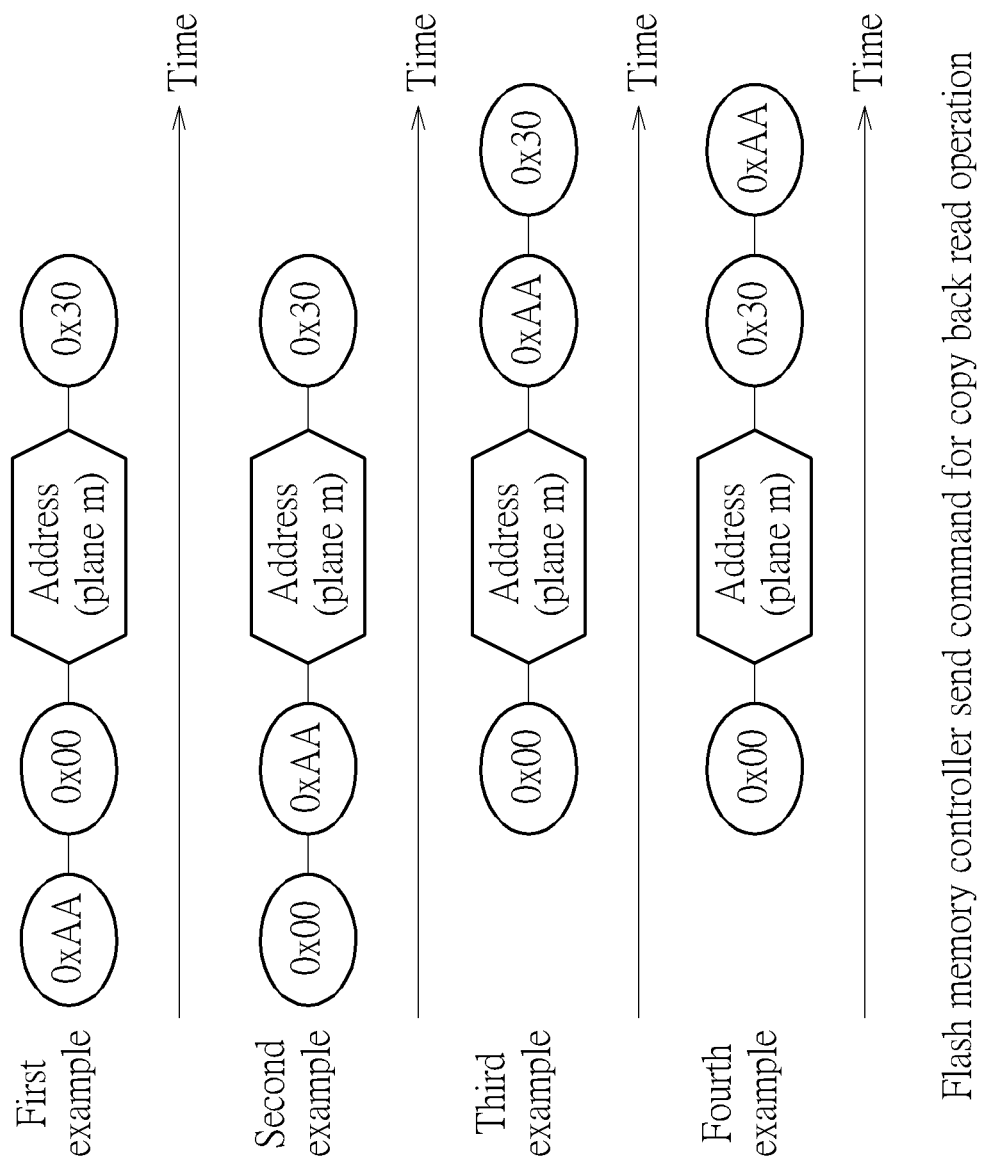
FIG. 11 is a diagram showing four examples of the command sequence sent by the flash memory controller for the copy back read operation according to an embodiment of the invention.

For example, compared to the four command sequences in the first sub-step of FIG. 2, FIG. 11 shows four examples of the command sequence sent by the flash memory controller 105 for the copy back read operation according to an embodiment of the invention. Each example is used to simplify the command sequences of the first sub-step of FIG. 2 as only one command sequence. As shown in FIG. 11, in the first example, the processor 1051 of the flash memory controller 105 controls the I/O circuit 1052 sequentially sending a specific indication command such as 0xAA (i.e. AAh), a copy back read command such as 0x00 (i.e. 00h), address information comprising only one plane address (e.g. address of the m-th plane) and corresponding block/page address, and the confirm command such as another read command such as 30h (but not limited) to the flash memory device 110; hexadecimal numbers can be written with and indicated by a leading "0x" or a trailing "h".

When receiving the specific indication command 0xAA and the copy back read command 0x00, the flash memory device 110 or control circuit 1103 in FIG. 10 can know that the information following the copy back command 0x00 for example comprises address information of a particular plane such as the m-th plane; in addition, when receiving the command 0x30, the flash memory device 110 or control circuit 1103 can know first sub-step in FIG. 2 is finished, and the address control circuit 1112 can control the row address decoder 1108 and column address decoder 1109 automatically switching to use the addresses of different planes based on only the address information of the m-th plane stored in the address register 1105. For example, the address control circuit 1112 can generate the addresses of all the planes and use the generated addresses to control the row address decoder 1108 and column address decoder 1109 performing automatic address switching to select block/page units corresponding to specific block/page address at all the different planes, so that the page data and/or block data corresponding to specific block/page address at all the different planes can be transmitted from (or copied back from) the memory cell array 1107 into the data register 1110. That is, the copy back operation is performed after the confirm command 0x30 is received.

Further, in other embodiments, the address control circuit 1112 can generate the addresses of only some planes based on the default setting or the configuration dynamically determined by the flash memory controller 105, wherein the configuration can be determined by plane bit map information and/or block address information sent from the flash memory controller 105, which can be set by a set-feature signal and will be explained later. The address control circuit 1112 can be arranged to generate corresponding plane address (es) and select its corresponding address buffer(s) to perform decoding according to the corresponding plane address(es).

In the second example of FIG. 11, the specific indication command can be positioned between the copy back read command and address information. The processor 1051 of the flash memory controller 105 controls the I/O circuit 1052 sequentially sending the copy back read command such as 0x00 (i.e. 00h), the specific indication command such as 0xAA (i.e. AAh), address information comprising only one plane address (e.g. address of the m-th plane) and corresponding block/page address information, and the another read command such as 30h (but not limited) to the flash memory device 110. The other operations of the second example are similar to those of the first example and are not detailed.

Further, in the third example of FIG. 11, the specific indication command can be positioned between address information and the command 0x30. The processor 1051 of the flash memory controller 105 controls the I/O circuit 1052 sequentially sending the copy back read command such as 0x00 (i.e. 00h), address information comprising only one plane address (e.g. address of the m-th plane) and corresponding block/page address, the specific indication command such as 0xAA (i.e. AAh), and the another read command such as 30h (but not limited) to the flash memory device 110. The other operations of the second example are similar to those of the first example and are not detailed.

Further, in the fourth example of FIG. 11, the specific indication command may be positioned later than the command 0x30. The processor 1051 of the flash memory controller 105 controls the I/O circuit 1052 sequentially sending the copy back read command such as 0x00 (i.e. 00h), address information comprising only one plane address (e.g. address of the m-th plane) and corresponding block/page address, the another read command such as 30h (but not limited), and the specific indication command such as 0xAA (i.e. AAh) to the flash memory device 110. The other operations of the second example are similar to those of the first example and are not detailed.

Figure 12:
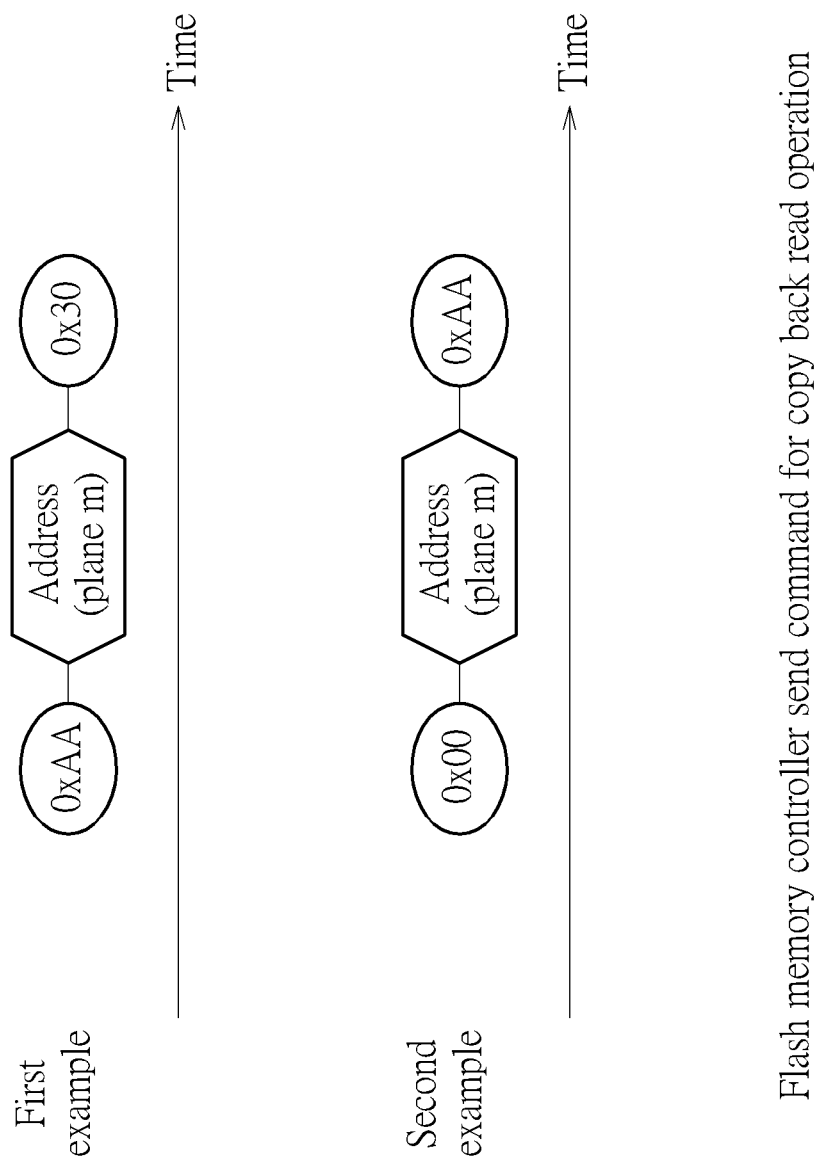
FIG. 12 is a diagram showing two examples of the command sequence sent by the flash memory controller for the copy back read operation according to an embodiment of the invention.

FIG. 12 shows two examples of the command sequence sent by the flash memory controller 105 for the copy back read operation according to an embodiment of the invention. In the first example of FIG. 12, the specific indication command 0xAA is used to replace the function of the copy back command 0x00, and in this situation the flash memory device 110 can know and confirm that the command sequence is simplified and the information following the command 0xAA is the address information of a particular plane such as the m-th plane and block/page address information.

In the second example of FIG. 12 the specific indication command 0xAA is used to replace the function of the confirm command 0x30, and in this situation the flash memory device 110 can know and confirm that the command sequence is simplified and the end of such command sequence after receiving such specific indication command 0xAA. In either of the both the examples, after receiving the block/page address (es) of the m-th plane, the flash memory device 110 is arranged to automatically generate block/page addresses of multiple or all planes according to only the block/page address information of the m-th plane. This effectively simplifies multiple command sequences into only one command sequence.

Figure 13:
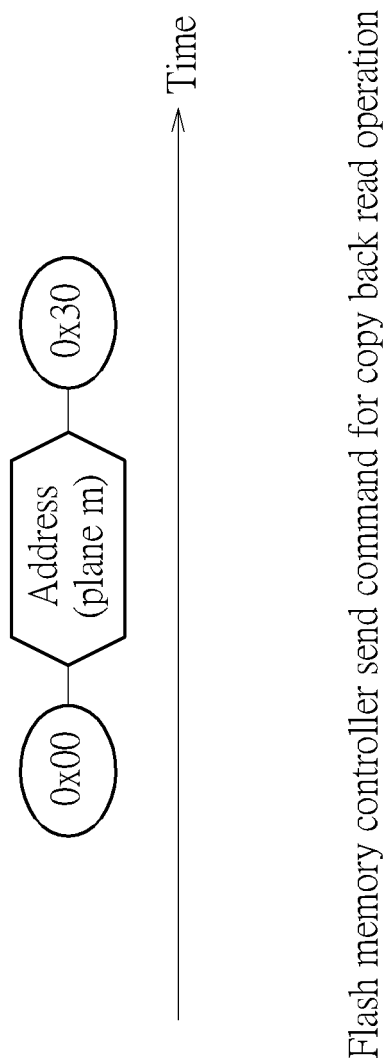
FIG. 13 is a diagram showing an example of the command sequence sent by the flash memory controller for the copy back read operation according to an embodiment of the invention.

FIG. 13 shows an example of the command sequence sent by the flash memory controller 105 for the copy back read operation according to an embodiment of the invention. In FIG. 13, in the default setting, the flash memory device 110 enables the command sequence simplification operation after the flash memory device 110 is powered on. The setting of the flash memory device 110 can be dynamically adjusted by the flash memory controller 105 through the communication of a set-feature signal. In the example of FIG. 13, the processor 1051 of the flash memory controller 105 controls the I/O circuit 1052 sequentially sending the copy back read command such as 0x00 (i.e. 00h), address information comprising only one plane address (e.g. address of the m-th plane) and corresponding block/page address information, and the another read command such as 30h (but not limited), to the flash memory device 110 without sending the specific indication command 0xAA mentioned above. In this situation, the flash memory device 110 after receiving the above-mentioned command sequence can confirm the execution of the automatic address switching.

Figure 14:
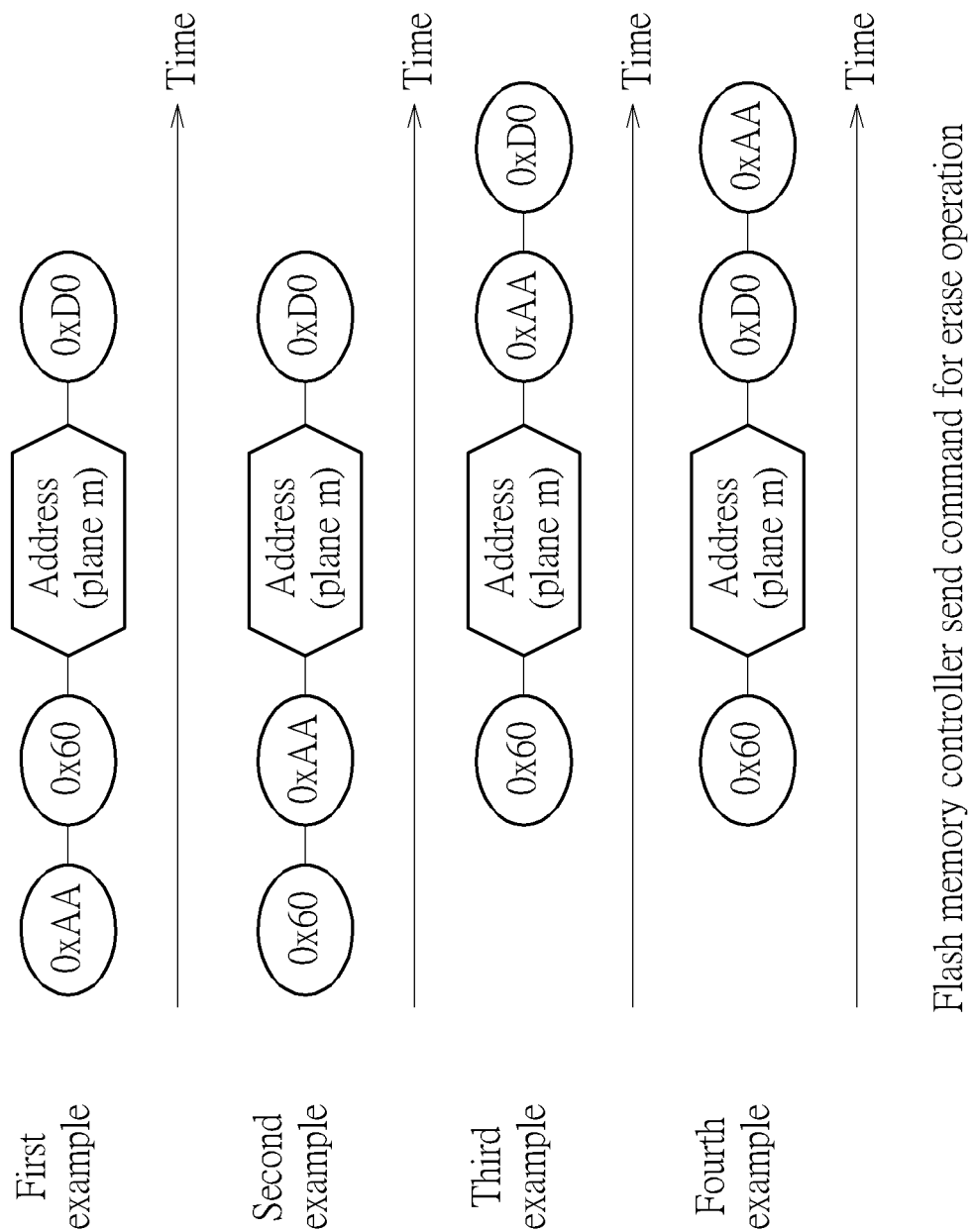
FIG. 14 is a diagram showing four examples of the command sequence sent by the flash memory controller for an erase operation according to an embodiment of the invention.

FIG. 14 shows four examples of the command sequence sent by the flash memory controller 105 for an erase operation according to an embodiment of the invention. Each example is used to simplify the command sequences of the erase operation as only one command sequence. As shown in in the first example of FIG. 14, the processor 1051 of the flash memory controller 105 controls the I/O circuit 1052 sequentially sending the specific indication command 0xAA, the erase command such as 0x60 (i.e. 60h), address information such as block address data/information of one plane such as the m-th plane, and the confirm command such as the command 0xD0 (i.e. D0h) to the flash memory device 110. For example, the block address data may indicate the block address for the n-th block of the m-th plane (but not limited). When receiving the specific indication command 0xAA and the command 0x60, the flash memory device 110 (or control circuit 1103) in FIG. 10 can know and confirm that the information following the command 0x60 comprises one or more block address information of the m-th plane; in addition, when receiving the command 0xD0, the flash memory device 110 (or control circuit 1103) can be arranged to start executing the erase operation upon the block(s) corresponding to one or more block address information at the different planes including the m-th plane. In this situation, the address control circuit 1112 can automatically expand the block address information of the m-th plane into the same block address information at the different planes including the m-th plane, e.g. all the planes. Then, the address control circuit 1112 controls the row address decoder 1108 and column address decoder 1109 automatically and sequentially switching to corresponding address (es) to erase corresponding block unit(s) at the different planes based on the expanded block addresses information at the different planes.

For example, in one embodiment, a group of block units corresponding to the same block address information at different planes may form a super block unit. The flash memory controller 105 can send merely a single command sequence, including merely one plane's block address information, to the flash memory device 110 to make the flash memory device 110 erase the super block unit having the corresponding block units at the different planes. This significantly improves the performance of the flash memory device 110.

Similarly, in the second example of FIG. 14, the specific indication command may be positioned between the command 0x60 and the address information of the m-th plane. The processor 1051 of the flash memory controller 105 controls the I/O circuit 1052 sequentially sending the erase command 0x60, the specific indication command 0xAA, the block address information of the m-th plane, and the confirm command 0xD0 to the flash memory device 110. The other operations of the second example are similar to those of the first example and are not detailed.

Further, in the third example of FIG. 14, the specific indication command 0xAA can be positioned between the block address information and the command 0xD0. The processor 1051 of the flash memory controller 105 controls the I/O circuit 1052 sequentially sending the erase command 0x60, three-cycles block address information, the specific indication command 0xAA, and the command 0xD0 to the flash memory device 110. The other operations of the second example are similar to those of the first example and are not detailed.

Further, in the fourth example of FIG. 14, the specific indication command 0xAA may be positioned later than the command 0xD0. The processor 1051 of the flash memory controller 105 controls the I/O circuit 1052 sequentially sending the erase command 0x60, the block address information, the command 0xD0, and the specific indication command 0xAA to the flash memory device 110. The other operations of the second example are similar to those of the first example and are not detailed.

Figure 15:
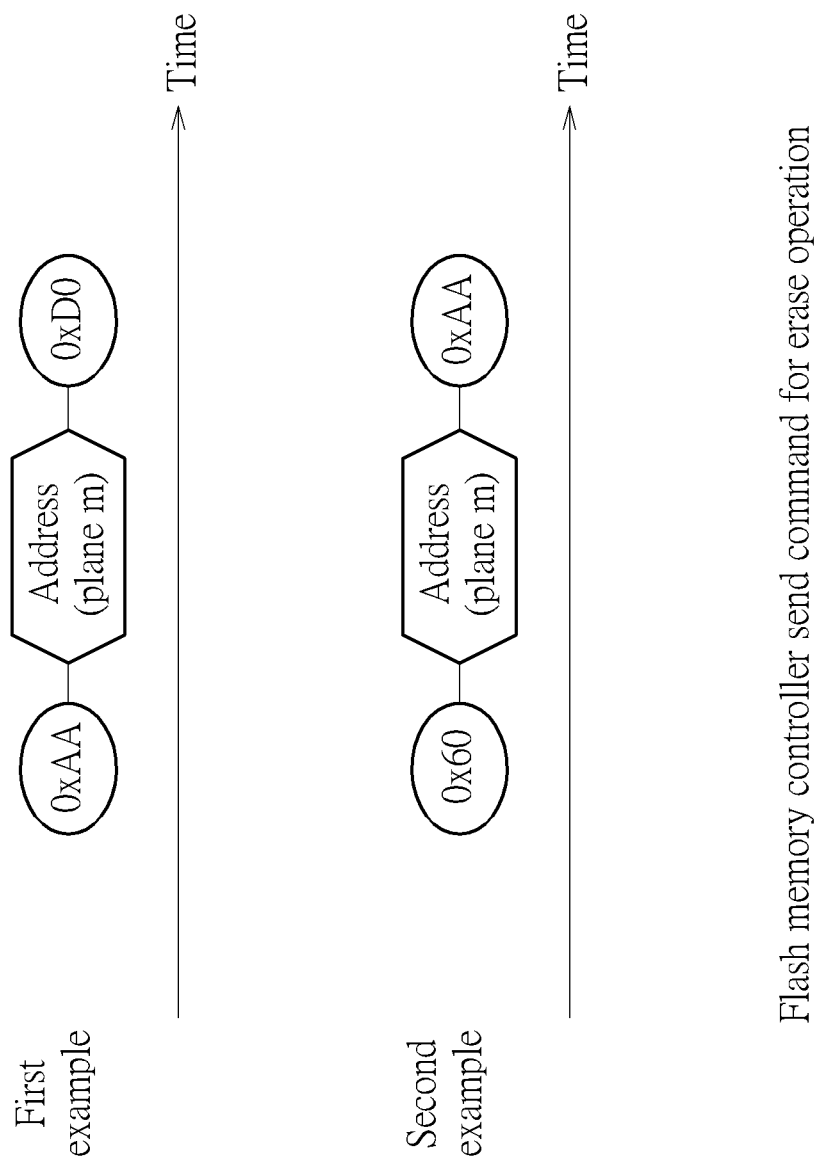
FIG. 15 is a diagram showing two examples of the command sequence sent by the flash memory controller for the erase operation according to an embodiment of the invention.

FIG. 15 shows two examples of the command sequence sent by the flash memory controller 105 for the erase operation according to an embodiment of the invention. In the first example of FIG. 15, the specific indication command 0xAA is used to replace the function of the erase command 0x60 (i.e. it is not needed to send the erase command 0x60), and in this situation the flash memory device 110 can know and confirm that the command sequence is simplified and the information following the command 0xAA is the block address information.

In the second example of FIG. 15 the specific indication command 0xAA is used to replace the function of the command 0xD0 (i.e. it is not needed to send the command 0xD0), and in this situation the flash memory device 110 can know and confirm that the command sequence is simplified and know that the command 0xAA is an end of the simplified command sequence. In either of the both the examples, after receiving the block address data of the m-th plane, the flash memory device 110 is arranged to automatically expand the block address data of the m-th plane into the same block addresses data for different planes. This effectively simplifies multiple command sequences into only one command sequence.

Figure 16:
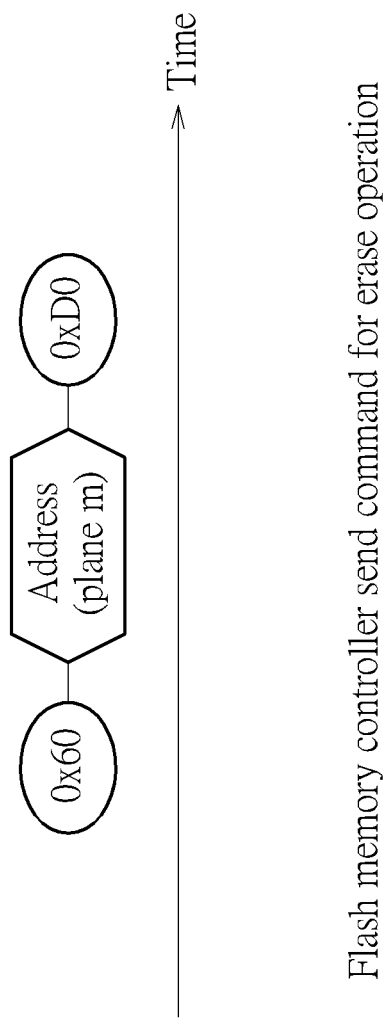
FIG. 16 is a diagram showing an example of the command sequence sent by the flash memory controller for the erase operation according to an embodiment of the invention.

FIG. 16 shows an example of the command sequence sent by the flash memory controller 105 for the erase operation according to an embodiment of the invention. In FIG. 16, in the default setting, the flash memory device 110 enables the command sequence simplification operation after the flash memory device 110 is powered on. The setting of the flash memory device 110 can be dynamically adjusted by the flash memory controller 105 through the communication of set-feature signal. Thus, in the example of FIG. 16, the processor 1051 of the flash memory controller 105 controls the I/O circuit 1052 sequentially sending the erase command 0x60, block address information of the m-th plane, and the confirm command 0xD0 to the flash memory device 110 without sending the specific indication command 0xAA mentioned above. The flash memory device 110 can know the same function of the specific indication command 0xAA after receiving the erase command 0x60 or the confirm command 0xD0.

Further, in other embodiments, for performing the erase operation, the address control circuit 1112 can select and generate the block address information for partially selected plane(s) according to the block address information of only one plane based on the default setting or the configuration dynamically determined by the flash memory controller 105, wherein the configuration can be determined by plane bit map information. Additionally, the address control circuit 1112 can change the block address information for one or more different plane(s) based on the plane bit map information and/or block address information sent from the flash memory controller 105, wherein the plane bit map information and/or block address information can be set by a set-feature signal and will be explained later. The address control circuit 1112 can be arranged to generate corresponding plane address(es) and select corresponding address buffer(s) in the address decoder(s) to perform decoding according to the corresponding plane address(es).

Figure 17:
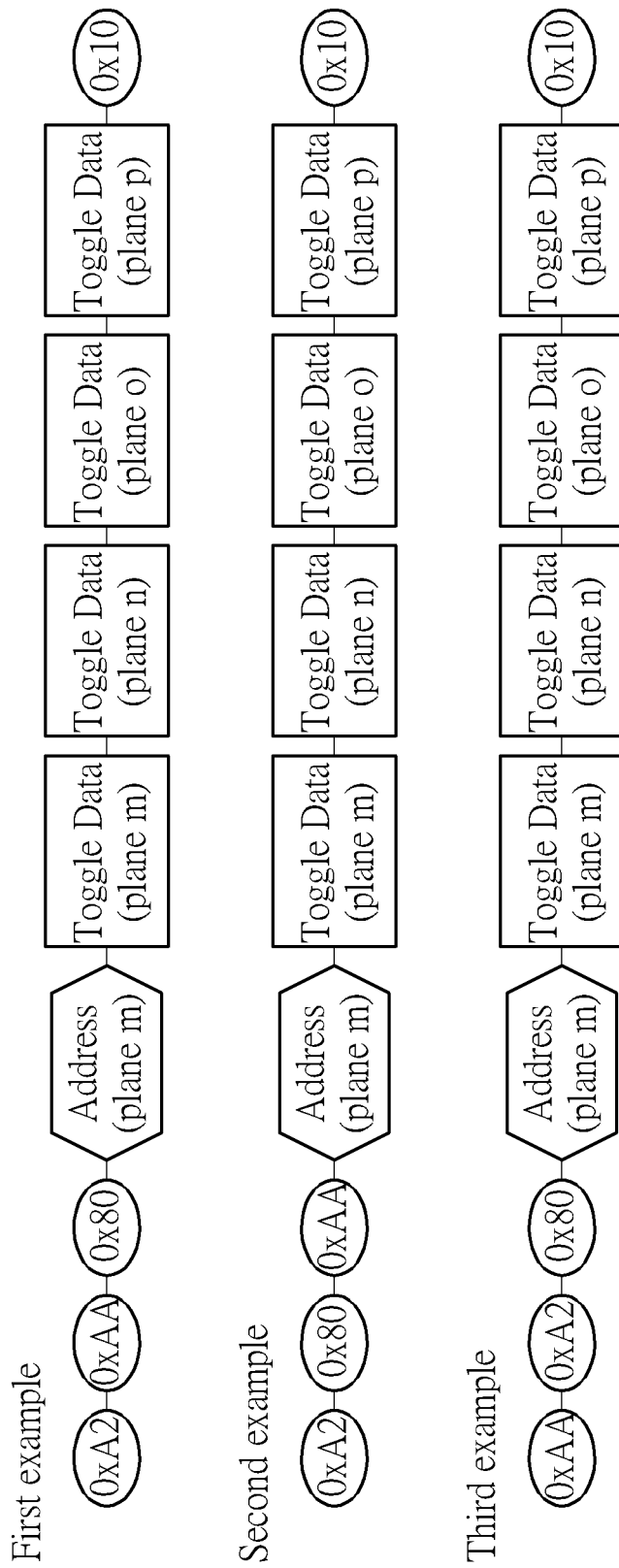
FIG. 17 is a diagram showing three examples of the command sequence sent by the flash memory controller for a write operation of SLC mode according to an embodiment of the invention.

FIG. 17 shows three examples of the command sequence sent by the flash memory controller 105 for a write operation of SLC mode according to an embodiment of the invention. In the first example of FIG. 17, the flash memory controller 105 sequentially sending an SLC programming instruction/command such as 0xA2 (but not limited), a specific indication command 0xAA, a page program command such as the command 0x80 (but not limited), block address and page address information of the m-th plane, multiple toggle page data to be programed, and a write confirm command such as a confirm command such as the command 0x10 (but not limited) to the flash memory device 110. The multiple toggle page data to be programed for example (but not limited) may comprise a first toggle page data to be programed into a page of the m-th plane, a second toggle page data to be programed into a page of the n-th plane, a third toggle page data to be programed into a page of the o-th plane, and a fourth toggle page data to be programed into a page of the p-th plane. The m-th plane, n-th plane, o-th plane, and p-th plane for example are planes having the index numbers 0, 1, 2, and 3; however, in other examples, the m-th plane may be one of the planes having the index numbers 1, 2, and 3, and this is not meant to be a limitation. In addition, the number of toggle page data to be programed is also not intended to be a limitation.

In the second example of FIG. 17, the flash memory controller 105 sequentially sending the SLC programming command 0xA2, page program command 0x80, specific indication command 0xAA, block address and page address information of the m-th plane, multiple toggle page data to be programed, and the write confirm command 0x10 to the flash memory device 110.

In the third example of FIG. 17, the flash memory controller 105 sequentially sending the specific indication command 0xAA, the SLC programming command 0xA2, page program command 0x80, block address and page address information of the m-th plane, multiple toggle page data to be programed, and the write confirm command 0x10 to the flash memory device 110.

The SLC programming command 0xA2 is used to indicate the SLC program/write mode, and the flash memory device 110 when receiving the command 0xA2 can know that a write operation operates under the SLC mode. The page program command 0x80 is used to indicate a program/write operation. In addition, once receiving the write confirm command 0x10, the flash memory device 110 can start to execute the SLC mode programming. In these examples of FIG. 17, the flash memory device 110 can automatically expand the block address and page address of a page in the m-th plane into the block addresses and page addresses of four pages (but not limited) respectively in the different planes (m-th plane, n-th plane, o-th plane, and p-th plane). Thus, the address control circuit 1112 can control the row address decoder 1108 and column address decoder 1109 select corresponding pages of corresponding physical blocks in the different planes so that the multiple toggle page data to be programed can be respectively and correctly stored into the selected pages of the different planes. This effectively improves the performance of writing a super page data into multiple page units respectively in the different planes of the flash memory device 110.

Figure 18:
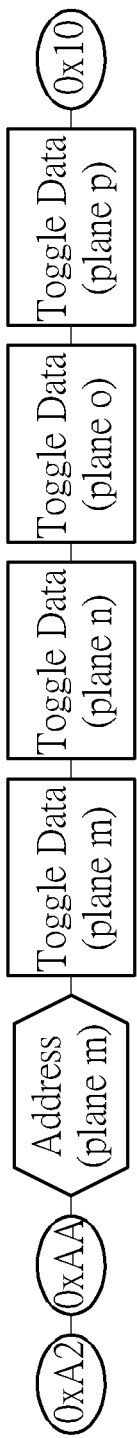
FIG. 18 is a diagram showing an example of the command sequence sent by the flash memory controller for a write operation of SLC mode according to another embodiment of the invention.

FIG. 18 shows an example of the command sequence sent by the flash memory controller 105 for a write operation of SLC mode according to another embodiment of the invention. In FIG. 18, the specific indication command 0xAA can replace or merge the function of the page program command 0x80. In this example, the flash memory controller 105 sequentially sends the SLC programming command 0xA2, specific indication command 0xAA, block address and page address information of a page of the m-th plane, multiple toggle page data to be programed, and the write confirm command 0x10 to the flash memory device 110. In this example, when receiving the specific indication command 0xAA, the flash memory device 110 can know and confirm that the write operation corresponding to a page write/program instruction/command is to be executed and the command sequence is simplified. The other descriptions are similar and not detailed for brevity.

Figure 19:
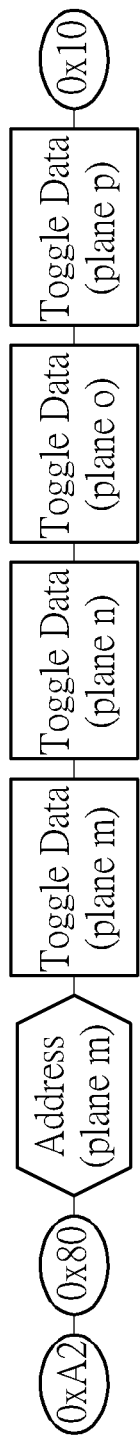
FIG. 19 is a diagram showing an example of the command sequence sent by the flash memory controller for the write operation of SLC mode according to another embodiment of the invention.

FIG. 19 shows an example of the command sequence sent by the flash memory controller 105 for the write operation of SLC mode according to another embodiment of the invention. In FIG. 19, the flash memory controller 105 sequentially sends the SLC programming command 0xA2, page program command 0x80, block address and page address information of a page of the m-th plane, multiple toggle page data to be programed, and the write confirm command 0x10 to the flash memory device 110, without sending the specific indication command 0xAA. In this example, in the default setting, the flash memory device 110 can know and confirm that the command sequence is simplified, and this it is not needed to send the specific indication command 0xAA. Equivalently, the function of specific indication command 0xAA is merged into and included by the page program command 0x80. The other descriptions are similar and not detailed for brevity.

Figure 20:
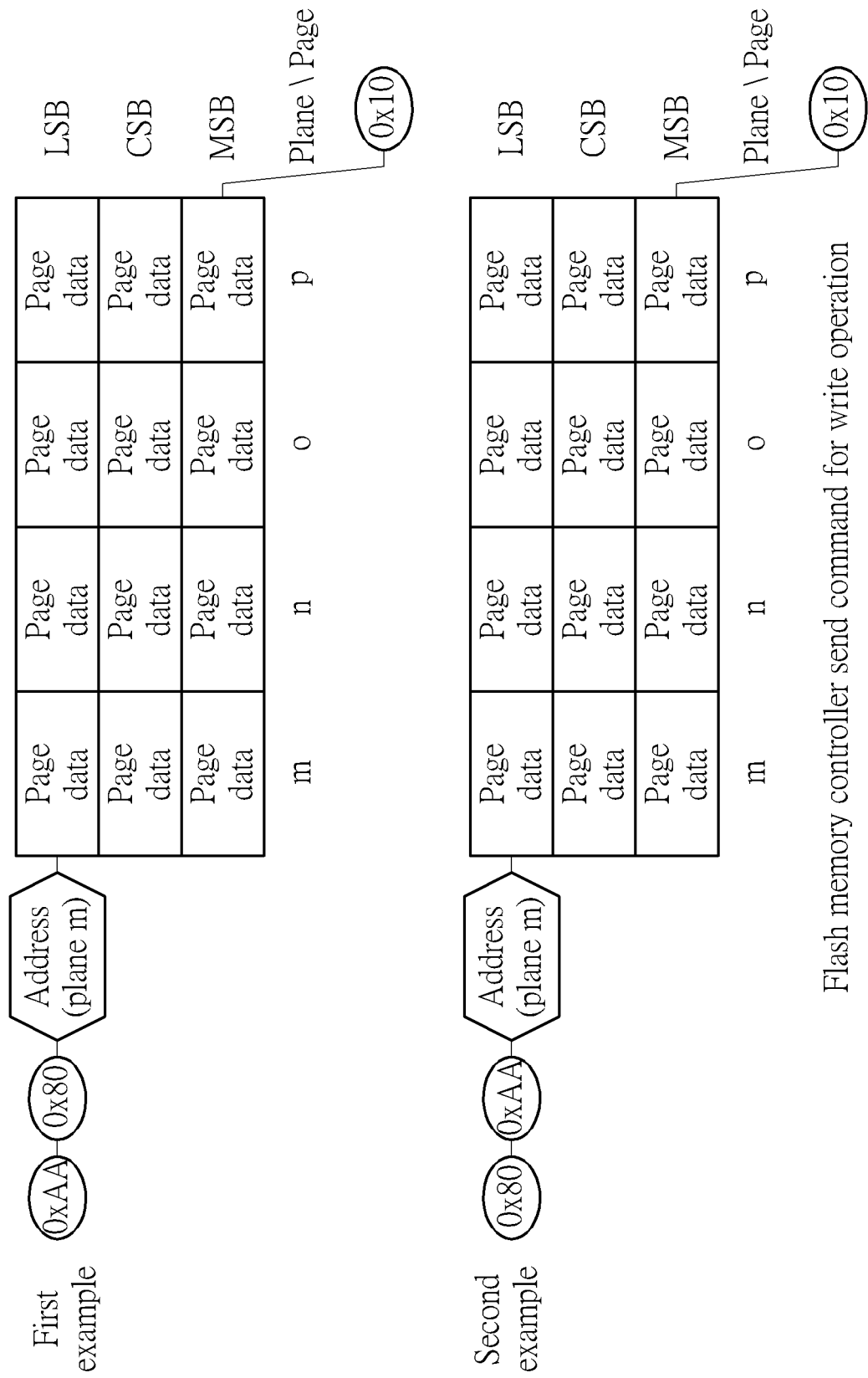
FIG. 20 is a diagram showing two examples of the command sequence sent by the flash memory controller for a write operation of TLC mode according to an embodiment of the invention.

Additionally, in other embodiments, the command sequences for the write operation of multiple level programming modes (e.g. MLC mode, TLC mode, QLC mode, and so on) can be simplified into a single one command sequence. FIG. 20 shows two examples of the command sequence sent by the flash memory controller 105 for a write operation of TLC mode according to an embodiment of the invention. In the first example of FIG. 20, the flash memory controller 105 sequentially sends the specific indication command 0xAA, page program command 0x80, block address and page address information of an LSB/CSB/MSB page of the m-th plane, multiple toggle LSB (least significant bit) page data to be programed, multiple toggle CSB (center significant bit) page data to be programed, multiple toggle MSB (most significant bit) page data to be programed, and the confirm command 0x10 to the flash memory device 110. The multiple toggle LSB page data to be programed for example (but not limited) may comprise a first LSB page data to be programed into an LSB page of the m-th plane, a second LSB page data to be programed into an LSB page of the n-th plane, a third LSB page data to be programed into an LSB page of the o-th plane, and a fourth LSB page data to be programed into an LSB page of the p-th plane. The multiple CSB page data to be programed for example (but not limited) may comprise a first CSB page data to be programed into a CSB page of the m-th plane, a second CSB page data to be programed into a CSB page of the n-th plane, a third CSB page data to be programed into a CSB page of the o-th plane, and a fourth CSB page data to be programed into a CSB page of the p-th plane. Similarly, the multiple MSB page data to be programed for example (but not limited) may comprise a first MSB page data to be programed into an MSB page of the m-th plane, a second MSB page data to be programed into an MSB page of the n-th plane, a third MSB page data to be programed into an MSB page of the o-th plane, and a fourth MSB page data to be programed into an MSB page of the p-th plane. The number of LSB/CSB/MSB page data to be programed is not intended to be a limitation.

Further, for the writing operation under multiple level modes, in practice, the address control circuit 1112 (or control circuit 1103) can be used to record and count the number of LSB/CSB/MSB page data that have been written into the memory cell array 1107 so as to correctly write data into the corresponding units in the memory cell array 1107. Also, the counter circuit 1104 can be used to count and record the number of data bytes. The corresponding operations are not detailed for brevity.

In the second example of FIG. 20, the flash memory controller 105 sequentially sends the page program command 0x80, specific indication command 0xAA, block address and page address information of an LSB/CSB/MSB page of the m-th plane, multiple toggle LSB page data to be programed, multiple toggle CSB page data to be programed, multiple toggle MSB page data to be programed, and the write confirm command 0x10 to the flash memory device 110. That is, the position of specific indication command 0xAA in the simplified command sequence can be changed.

Figure 21:
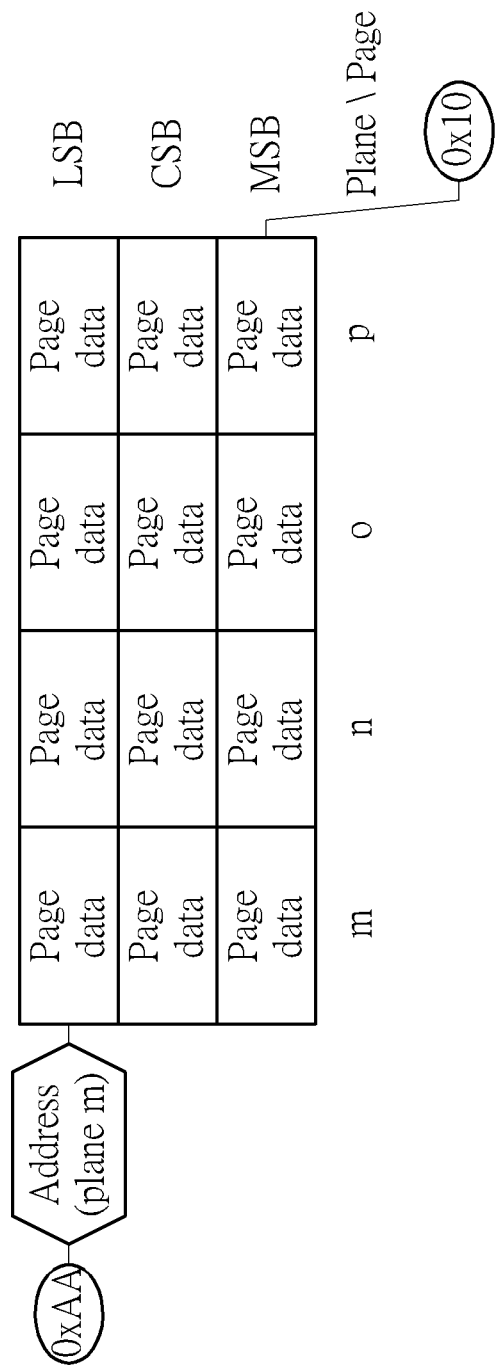
FIG. 21 is a diagram showing an example of the command sequence sent by the flash memory controller for the write operation of TLC mode according to another embodiment of the invention.

In other embodiments, for TLC mode programming, the function of page program command 0x80 can be replaced by the specific indication command 0xAA. FIG. 21 shows an example of the command sequence sent by the flash memory controller 105 for the write operation of TLC mode according to another embodiment of the invention. In the example of FIG. 21, the flash memory controller 105 sequentially sends the specific indication command 0xAA, block address and page address information of an LSB/CSB/MSB page of the m-th plane, the multiple toggle LSB page data to be programed, the multiple toggle CSB page data to be programed, the multiple toggle MSB page data to be programed, and the write confirm command 0x10 to the flash memory device 110. When receiving the specific indication command 0xAA in this example, the flash memory deice 110 can know that the write operation corresponding to a page program command 0x80 is to be executed under the TLC mode.

For example (but not limited), the block address and page address information of an LSB/CSB/MSB page of the m-th plane may comprise a block index number 30 and a page index number 3 for plane number 0, and the address control circuit 1112 of flash memory device 110 based on the above-mentioned address information can automatically generate a block index number (i.e. block address) 30 and a page index number (i.e. page address) 3 for plane number (i.e. plane address) 1, a block index number 30 and a page index number 3 for plane number 2, and a block index number 30 and a page index number 3 for plane number 3, a block index number 30 and a page index number 4 for plane number 0, a block index number 30 and a page index number 4 for plane number 1, a block index number 30 and a page index number 4 for plane number 2, a block index number 30 and a page index number 4 for plane number 3, a block index number 30 and a page index number 5 for plane number 0, a block index number 30 and a page index number 5 for plane number 1, a block index number 30 and a page index number 5 for plane number 2, and a block index number 30 and a page index number 5 for plane number 3.

Figure 22:
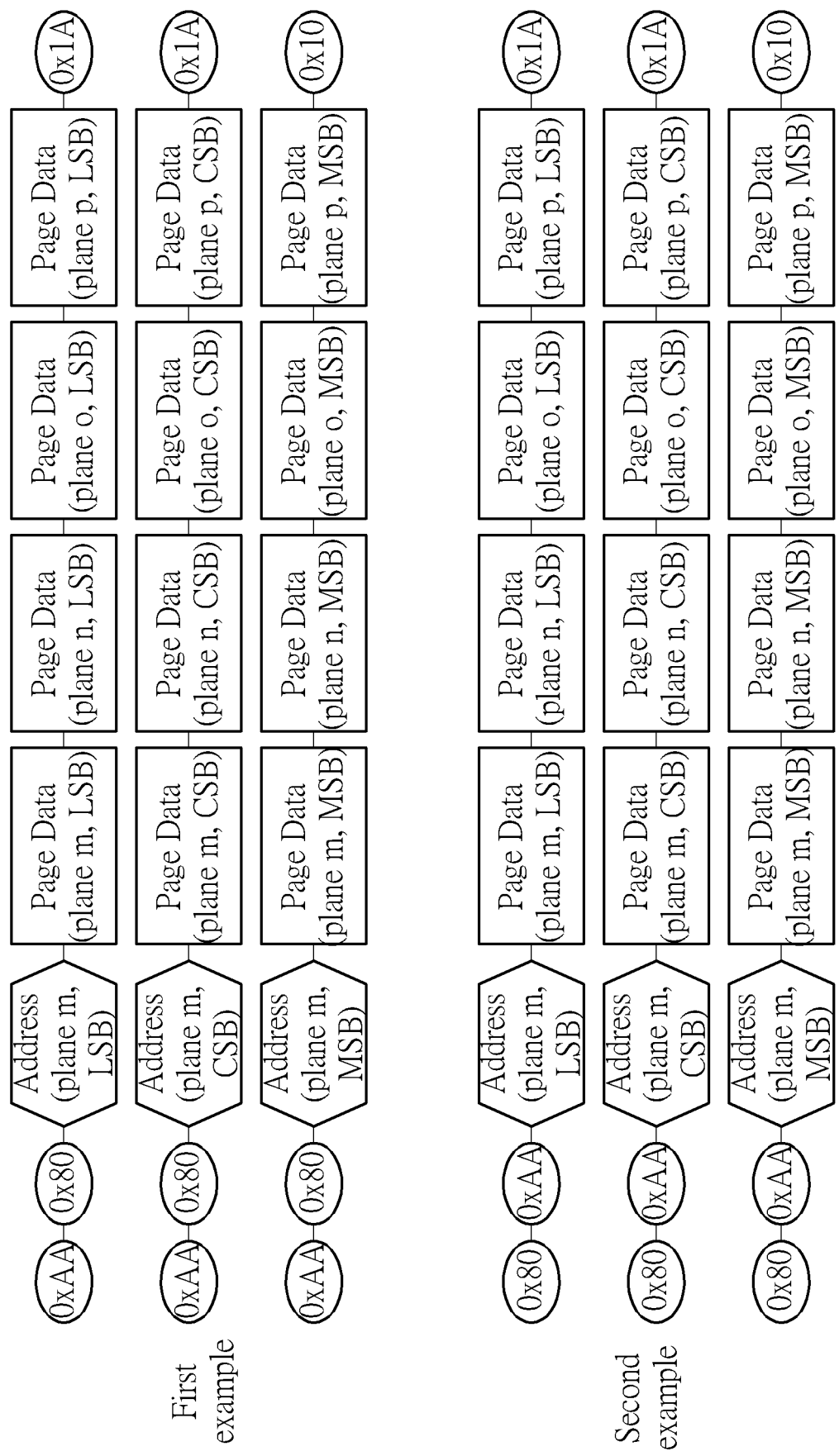
FIG. 22 is a diagram showing two examples of the command sequence sent by the flash memory controller for the write operation of TLC mode according to another embodiment of the invention.

In other embodiment, the address control circuit 1112 can be arranged to automatically generate the page address information pages of an LSB/CSB/MSB super page in the different planes in response to page address of only one LSB/CSB/MSB page at one plane. FIG. 22 shows two examples of the command sequence sent by the flash memory controller 105 for the write operation of TLC mode according to another embodiment of the invention. In the example of FIG. 22, the flash memory controller 105 sequentially sends three command sub-sequences. At the first, the flash memory controller 105 sends the first command sub-sequence including the specific indication command 0xAA, page program command 0x80, block address and page address information of an LSB page of the m-th plane, multiple toggle LSB page data to be programed, and an intermediate confirm command such as a change write command such as the command 0x1A (but not limited). The command 0x1A is used to indicate the end of a command sub-sequence. Then, the flash memory controller 105 sends the second command sub-sequence including the specific indication command 0xAA, page program command 0x80, block address and page address information of a CSB page of the m-th plane, multiple toggle CSB page data to be programed, and the command 0x1A. Finally, the flash memory controller 105 sends the third command sub-sequence including the specific indication command 0xAA, page program command 0x80, block address and page address information of an MSB page of the m-th plane, and the write confirm command 0x10. It should be noted that the order of the above command sub-sequences can be changed, and for example the command sub-subsequence associate with the MSB page data can be transmitted at first while the command sub-subsequence associate with the LSB page data can be transmitted finally; this also falls within the scope of the invention.

In the second example of FIG. 22, the specific indication command 0xAA can be positioned between the page program command 0x80 and the corresponding address information. For example (but not limited), when receiving the address information of the first command sub-sequence, e.g. a block index number 30 and a page index number 3 for plane number 0, the address control circuit 1112 of flash memory device 110 based on the above-mentioned address information can automatically generate a block index number 30 and a page index number 3 for plane number 1, a block index number 30 and a page index number 3 for plane number 2, and a block index number 30 and a page index number 3 for plane number 3; the block/page index number indicates the block/page address. When receiving the command 0x1A of the first command sub-sequence, the flash memory device 110 temporarily stores the multiple toggle LSB page data to be programed and then waits for the writing of a next page such as CSB page. Then, the flash memory controller 105 sends the second command sub-sequence including a block index number 30 and a page index number 4 (i.e. next page) for plane number 0, and the flash memory device 110 for example automatically generates a block index number 30 and a page index number 4 for plane number 1, a block index number 30 and a page index number 4 for plane number 2, and a block index number 30 and a page index number 4 for plane number 3. This is also similar for the writing of MSB page and is not detailed for brevity.

Figure 23:
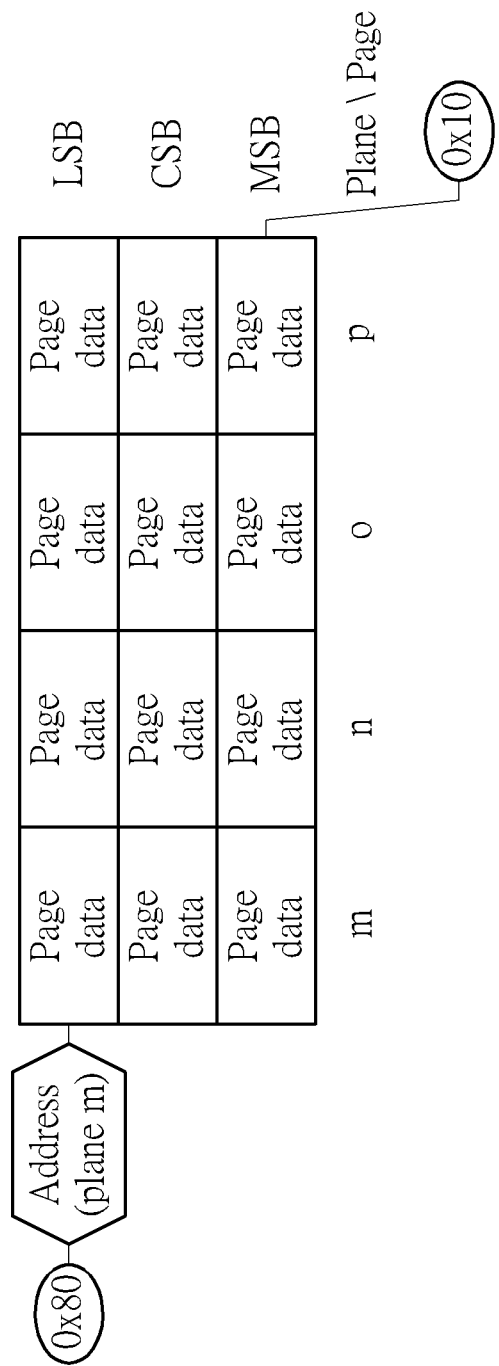
FIG. 23 is a diagram showing an example of the command sequence sent by the flash memory controller for the write operation of TLC mode according to another embodiment of the invention.

In other embodiment, the function of specific indication command 0xAA can be merged into and included by the page program command 0x80, and it is not needed to send the specific indication command 0xAA. FIG. 23 shows an example of the command sequence sent by the flash memory controller 105 for the write operation of TLC mode according to another embodiment of the invention. In the example of FIG. 23, the flash memory controller 105 sequentially sends the page program command 0x80, block address and page address information of an LSB/CSB/MSB page of the m-th plane, the multiple toggle LSB page data to be programed, the multiple toggle CSB page data to be programed, the multiple toggle MSB page data to be programed, and the write confirm command 0x10 to the flash memory device 110. The other operations and function are similar to those mentioned in the example of FIG. 21, and are not detailed for brevity.

Figure 24:
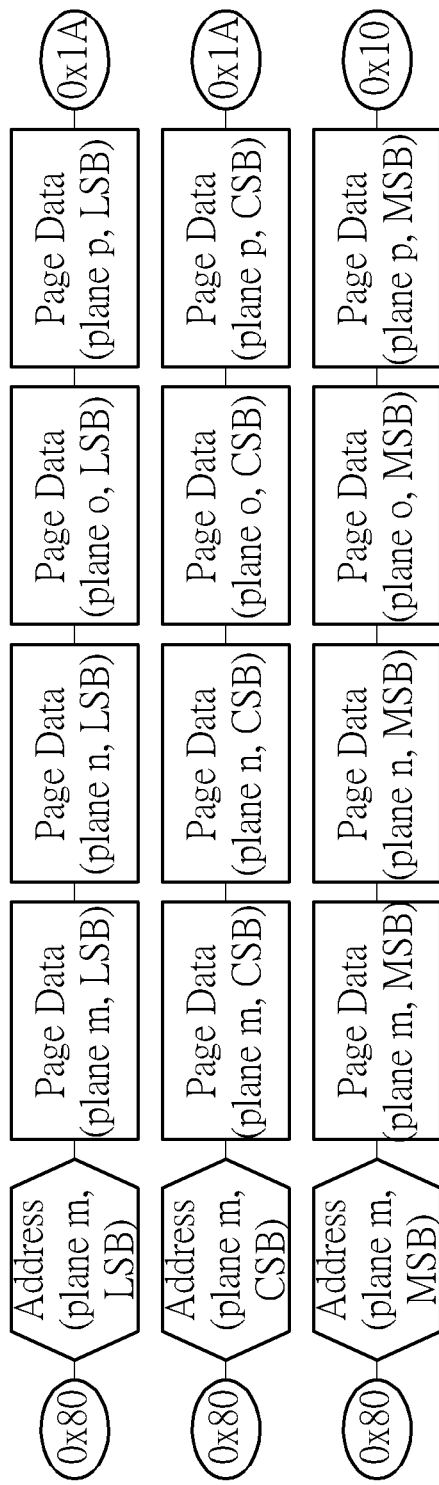
FIG. 24 is a diagram showing the example of the command sequence sent by the flash memory controller for the write operation of TLC mode according to another embodiment of the invention.

In other embodiment, the function of command 0x1A can be replaced by the specific indication command 0xAA. Alternatively, in other embodiment, the function of specific indication command 0xAA can be merged into the command 0x80. FIG. 24 shows the example of the command sequence sent by the flash memory controller 105 for the write operation of TLC mode according to another embodiment of the invention. In the example of FIG. 24, the function and position of specific indication command 0xAA in the command sub-sequences can be merged into the page program command 0x80. Other descriptions are not detailed again for brevity.

Figure 25:
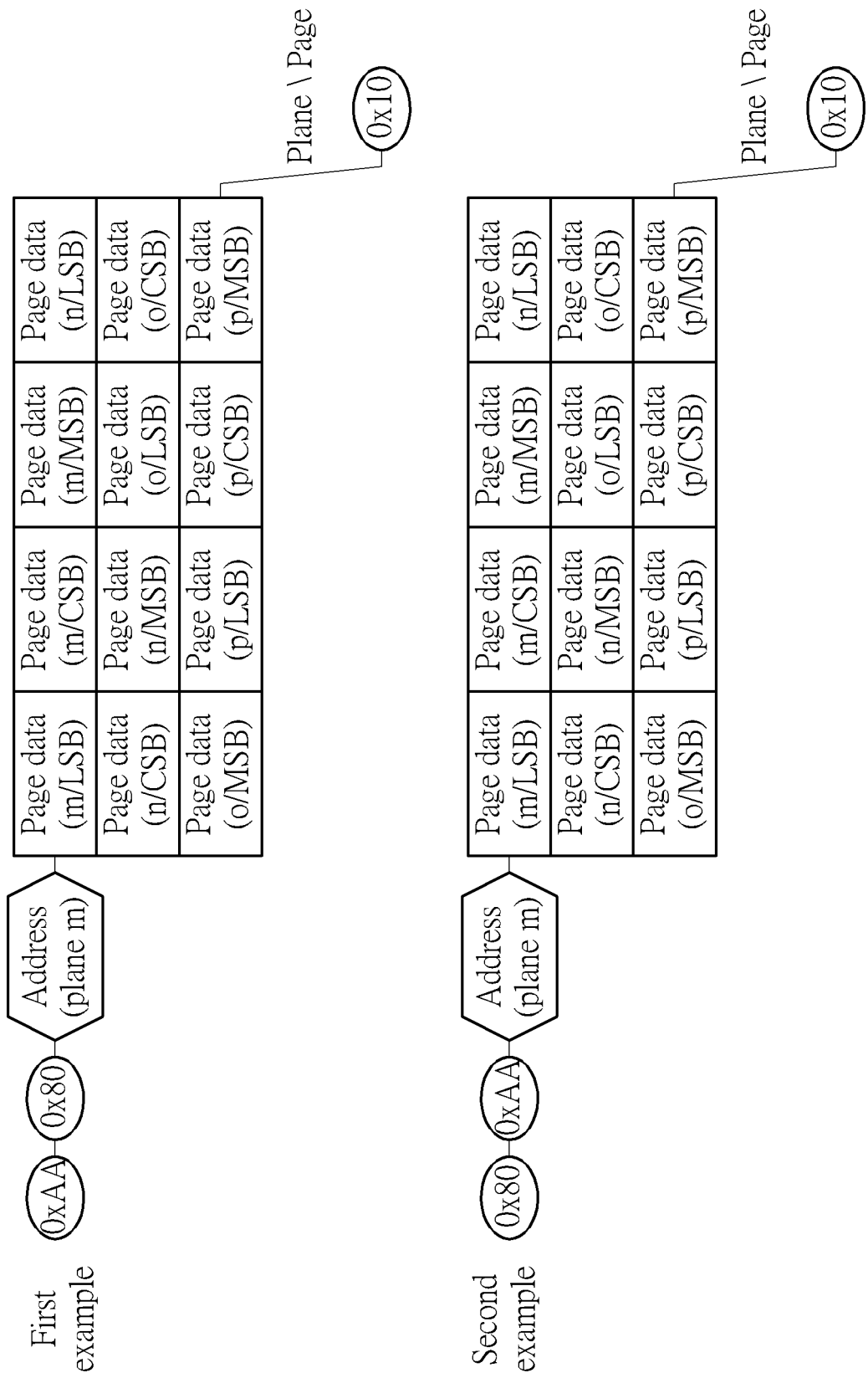
FIG. 25 is a diagram showing two examples of the command sequence sent by the flash memory controller for a write operation of TLC mode according to other embodiment of the invention.
Figure 26:
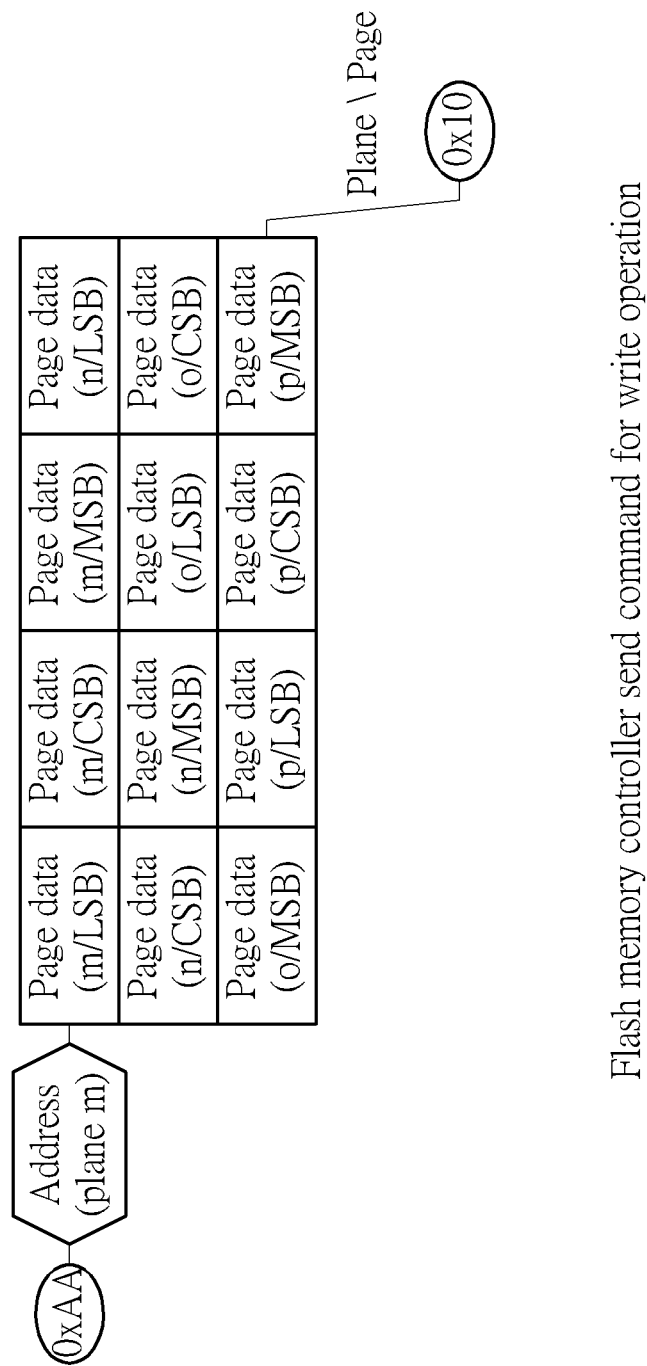
FIG. 26 is a diagram showing an example of the command sequence sent by the flash memory controller for the write operation of TLC mode according to other embodiment of the invention.
Figure 27:
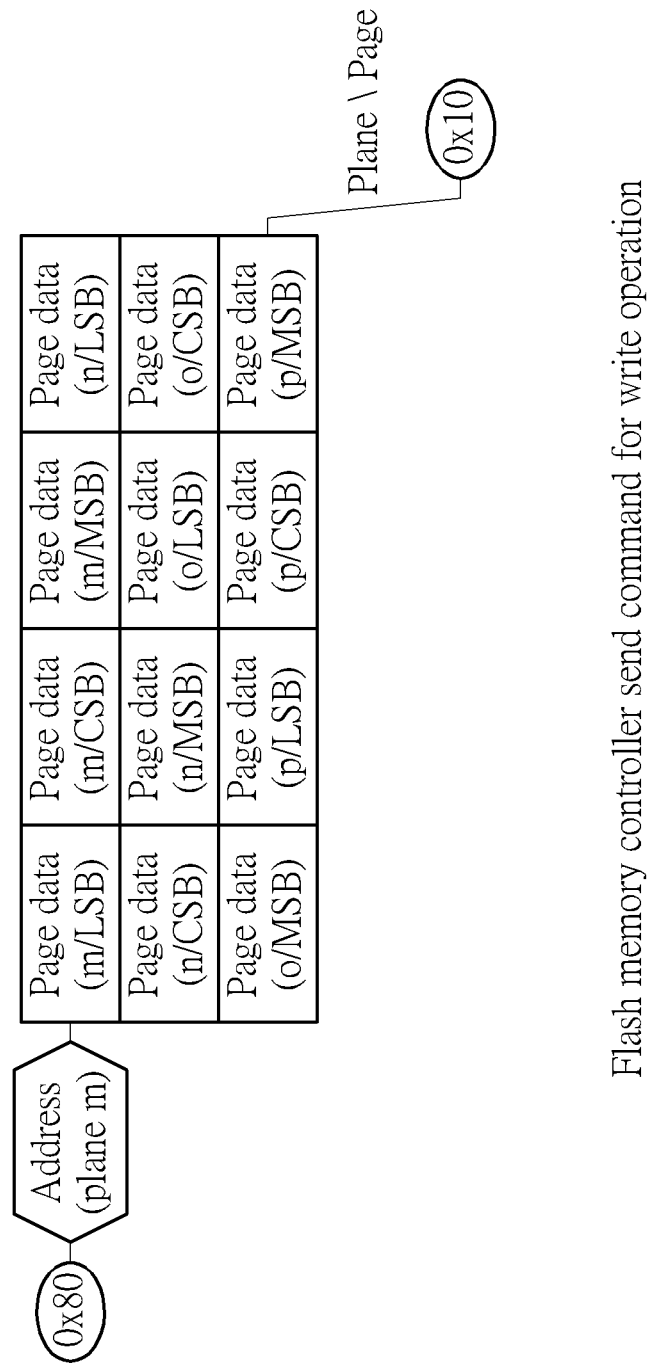
FIG. 27 is a diagram showing an example of the command sequence sent by the flash memory controller for the write operation of TLC mode according to other embodiment of the invention.

Further, the multiple toggle page data sequences to be programmed shown by FIG. 20, FIG. 21, and FIG. 23 can be rearranged in the different orders respectively shown by FIG. 25, FIG. 26, and FIG. 27. The transmission order of the toggle page data sequences can be arranged as the page data of LSB page of the m-th plane, the page data of CSB page of the m-th plane, the page data of MSB page of the m-th plane, the page data of LSB page of the n-th plane, the page data of CSB page of the n-th plane, the page data of MSB page of the n-th plane, the page data of LSB page of the o-th plane, the page data of CSB page of the o-th plane, the page data of MSB page of the o-th plane, the page data of LSB page of the p-th plane, the page data of CSB page of the p-th plane, and the page data of MSB page of the p-th plane. The examples are not intended to be a limitation of the invention.

In the above embodiments, the specific indication command for example can be implemented by using the command 0xAA and can be configure to be different from a standard command (or a vendor specific command) and may be implemented by using a reserved command such as 0Bh, 12h, 14h, 18h, 1Bh-1Ch, 62h-64h, 76h, 82h-83h, 86h, and 8Eh wherein 'h' means hexadecimal. The following table shows the different examples of the reserved commands which can be used to implement the data toggle command:

| Type | Opcode |
| --- | --- |
| Standard Command Set | 00h, 05h-06h 10h-11h, 15h, 30h-32h, 35h, 3Fh, 60h, 70h, 78h, 80h-81h, 85h, 90h, D0h-D1h, D4h-D5h, D9h, E0h-E2h, ECh-EFh, F1h-F2h, F9h, FAh, FCh, FFh |
| Vendor Specific | 01h-04h, 07h-0Ah, 0Ch-0Fh, 13h, 16h-17h, 19h-1Ah, 1Dh-2Fh, 33h-34h, 36h-3Eh, 40h-5Fh, 61h, 65h-6Fh, 71h-75h, 77h, 79h-7Fh, 84h, 87h-8Dh, 8Fh, 91h-CFh, D2h-D3h, D6h-D8h, DAh-DFh, E3h-EBh, F0h, F3h-F8h, FBh, FD-FEh |
| Reserved | 0Bh, 12h, 14h, 18h, 1Bh-1Ch, 62h-64h, 76h, 82h-83h, 86h, 8Eh |

It should be noted that an example of the specific indication command can be equal to the example of the above-mentioned data toggle command. This is not intended to be a limitation of the invention.

Further, the feature information or parameter(s) of the copy back read operation, erase operation, or the write operation mentioned above can be determined, enabled, or disabled by the flash memory controller 105 through sending a copy back read set-feature signal, an erase set-feature signal, or a write set-feature signal to the flash memory device 110.

Figure 28:
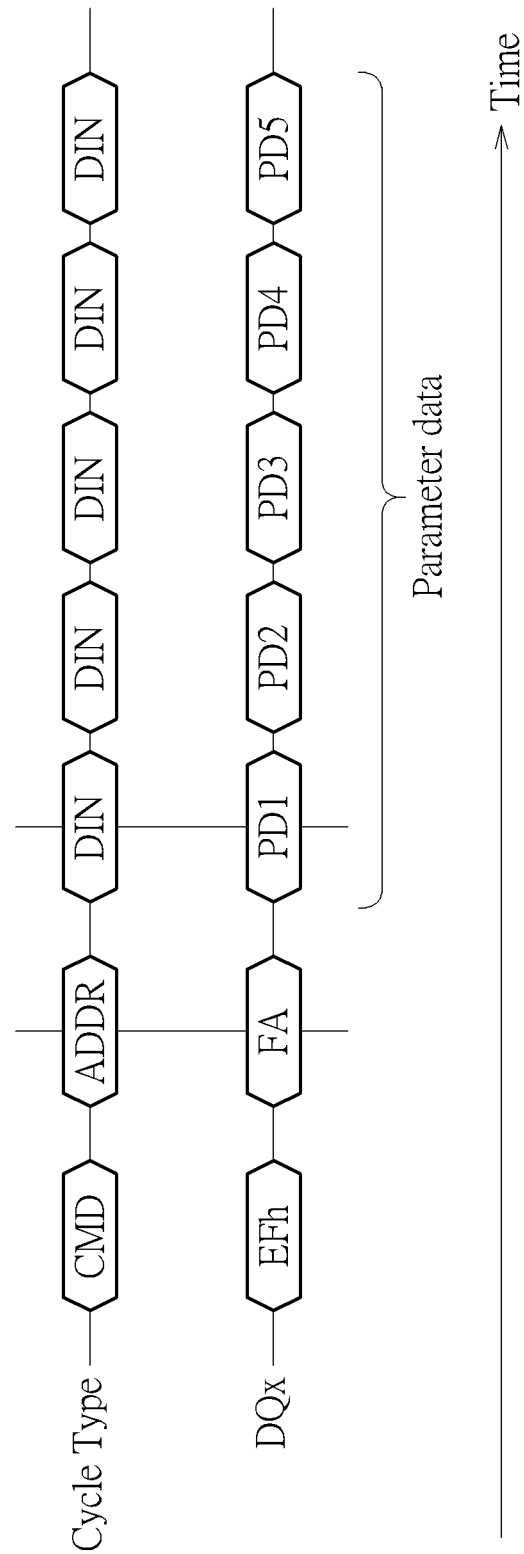
FIG. 28 is a diagram showing an example of setting the feature or parameters of the copy back read operation according to an embodiment of the invention.

FIG. 28 is a diagram showing an example of setting the feature or parameters of the copy back read operation according to an embodiment of the invention. The copy back read set-feature signal may comprise a set-feature command (cycle type indicated by CMD) EFh (but not limited) and a corresponding control information which follows the set-feature command EFh. The control information for example comprises the feature information FA (cycle type indicated by ADDR) and/or one or more parameter data PD1, PD2, PD3, PD4, and PD5 (cycle type indicated by DIN) to the flash memory device 110. The number and data lengths of parameter data are not intended to be a limitation, and one parameter data can be implemented using one or more bits or using one byte or more bytes if the number of totally used parameter data is less than four. The total data length of all parameter data can be configured to meet or match the requirements specified in the standards of flash memory controller/device products; for example (but not limited), the total data length can be configured as four bytes.

For setting the features or parameters of the copy back read operation, the content of feature information FA is determined by the flash memory controller 105 and is to be associated with the copy back read operation, and thus when receiving such feature information FA the flash memory device 110 can know that the following parameter data/bits is/are used for setting the copy back read operation. For example, the parameter data PD1 for example are implemented by four bits B0-B3 or more bits such as eight bits.

The bit B0 of parameter data PD1 for setting the copy back read operation is used to indicate whether to enable or disable the copy back read operation. When the bit B0 is set as the first logic bit such as '1', the copy back read operation, to be performed by the flash memory device 110, can be enabled and configured as a sequential mode in which the flash memory device 110 will be arranged to sequentially transmit block/page data units having the same block/page address information and respectively located in all the different planes from the memory cell array 1107 to the data register 1110. For instance, in this situation, the flash memory controller 105 may send a simplified command sequence carrying the copy back read command (or specific indication command) and the address information which indicates a block index number (i.e. block address) 30 for the plane number 1, and the flash memory device 110 after receiving such simplified command sequence may automatically switch to the different planes to transmit block data units having the same index number 30 and respectively corresponding to all the plane numbers 0-3 if the flash memory device 110 has four planes.

In other embodiment, the flash memory controller 105 may send a simplified command sequence carrying the copy back read command (or specific indication command) and the address information which indicates a block index number (i.e. block address) 30 for the plane number 1, and the flash memory device 110 after receiving such simplified command sequence may automatically switch to the different planes and transmit block data units having the same block index number 30 and respectively corresponding to the plane numbers 1-3 and transmit a block data unit corresponding to a next block index number 31 and the plane number 0. This also falls within the scope of the invention.

Alternatively, when the bit B0 is set as the second logic bit such as '0', the copy back read operation of the flash memory device 110 is disabled. In this situation, the execution of the copy back read operation is disabled and stopped, and the flash memory controller 105 needs to send multiple command sequences, which respectively comprise the different plane address/number information, to the flash memory device 110 to make the memory cell array 1107 transmit corresponding block/page data of the different planes to the data register 1110.

The bit B1 of parameter data PD1 for setting the copy back read operation is used to indicate whether the copy back read operation uses the updated bit map information sent from the flash memory controller 105 or automatically calculates and obtains the bit map information by itself for the different planes. When the bit B1 is set as the first logic bit '1', the copy back read operation is performed based on a bit map information which is automatically calculated and stored by the flash memory device 110. Alternatively, when the bit B1 is set as the second logic bit '0', the copy back read operation is performed based on a bit map information which is updated by the flash memory controller 105. It should be noted that the bit map information, sent from the flash memory controller 105 to the flash memory device 110, can be transmitted by using the feature information FA or by using other control information/signals sent from the flash memory controller 105.

Figure 29:
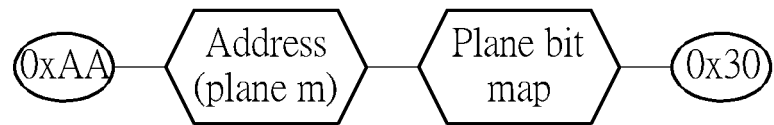
FIG. 29 is a diagram showing an example of the flash memory controller using other control information/signals to send the bit map information used for setting the copy back read operation.

FIG. 29 shows an example of the flash memory controller 105 using other control information/signals to send the bit map information used for setting the copy back read operation. In FIG. 29, the flash memory controller 105 sends the specific indication command 0xAA, address information, plane bit map information, and a confirm command such as the command 0x30 (but not limited). The plane bit map information may be positioned between the specific indication command 0xAA and the address information in other embodiment. The plane bit map information for example can be implemented by using at least one byte (but not limited) to indicate which plane(s) of the flash memory device 110 is to be selected by the copy back read operation triggered by this command sequence. That is, when the bit B1 of parameter data PD1 is set as '0', the flash memory device 110 can automatically transmit the corresponding block data unit(s) or page data unit(s) for the plane(s) requested/selected by the flash memory controller 105 based on the content of the plane bit map information received in such command sequence. For example, if the address information indicates the block index number 30 and the plane bit map information indicates '1010', then the flash memory device 110 can know and confirm that its copy back read operation is arranged to transmit the block data units having the same block index number 30 and only corresponding to the planes having planes numbers 1 and 3.

Further, it should be noted that in the address information may also comprise another plane bit information, and the flash memory device 110 can ignore such another plane bit information when the bit B1 of parameter data PD1 is set as '0'.

Further, since of the plane bit map information, the signal length of the command sequence for triggering a copy back read operation when the bit B1 of parameter data PD1 is set as '0' is different from that for triggering the copy back read operation when the bit B1 of parameter data PD1 is set as '1'.

Refer back to FIG. 28. The bit B2 of parameter data PD1 for setting the copy back read operation is used to indicate whether the copy back read operation is performed in response to a copy back read command or in response to a specific indication command. When the bit B2 is set as a first logic bit '1', the copy back read operation is configured to be performed in response to the specific indication command such as 0xAA. In this situation, when receiving a simplified command sequence carrying the specific indication command, the flash memory device 110 is arranged to automatically switch and select the different planes even though one plane number is received. When the specific indication command is not received, the flash memory device 110 is arranged to select a plane only corresponding to the plane number that is received from a command sequence. Alternatively, when the bit B2 is set as a second logic bit '0', the copy back read operation is configured to be performed in response to only the copy back read command such as 0x00. In this situation, the flash memory device 110 does not switch and select another different plane when receiving a particular plane number; the flash memory device 110 only selects the plane corresponding to the plane number that is received.

Further, in other embodiment, when the bit B2 is set as '1', the flash memory device 110 based on a default setting is arranged to automatically switch and select the different planes, and the flash memory controller 105 may further send a different specific indication command such as 0xBB (but not limited) to the flash memory device 110 to make the flash memory device 110 not switching and not selecting the different planes in addition to sending the command sequence associated with the copy back read operation.

Figure 30:
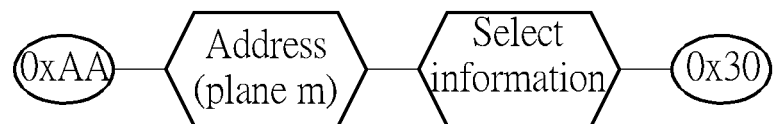
FIG. 30 is a diagram showing an example of the flash memory controller changing a block/page address/number for a different plane by sending the specific indication command 0xAA according to an embodiment of the invention.

The bit B3 of parameter data PD1 for setting the copy back read operation is used to indicate whether the copy back read operation can change block/page unit(s) for the different planes. When the bit B3 is set as a first logic bit '1', the copy back read operation can be performed to change a block/page address/number for a different plane in response to a request signal sent from the flash memory controller 105. Alternatively, when the bit B3 is set as a second logic bit '0', the copy back read operation is configured to be performed for the same block/page address/number for the different planes. Refer to FIG. 30. FIG. 30 shows an example of the flash memory controller 105 changing a block/page address/number for a different plane by sending the specific indication command 0xAA according to an embodiment of the invention. In FIG. 30, the flash memory controller 105 sends the specific indication command 0xAA, address information, select information, and the command 0x30. The select information for example can be implemented by using at least three bytes (but not limited) in which one byte can be used to indicate a plane number currently or dynamically selected/modified and other two bytes can be used to indicate a block/page index number currently or dynamically selected/modified; however, this is not intended to be a limitation of the invention. For example, the address information may indicate only the plane numbers 1 and 3, and the select information can indicate a different plane number 0 to make the flash memory device 110 switch to and select the plane having the plane number 0. This is similar for the block/page changing.

Further, in other embodiment, for the copy back read operation, the selection information mentioned above can be applied to and positioned between the address information and the command 0x30 in the examples of FIG. 11, FIG. 12, and FIG. 13; it can be positioned between the address information and the command 0xAA in other embodiment.

In addition, the parameter data PD1 may comprise other bits used for reserved functions of setting the copy back read operation. The other parameter data PD2, PD3, PD4, and PD5 may be reserved for setting the copy back read operation. This is not intended to be a limitation of the invention.

In other embodiments, the set-feature signal as shown in FIG. 28 can be applied into setting the feature or parameters of the erase operation or setting the feature or parameters of the write operation of SLC mode (or MLC/TLC/QLC mode). The set-feature signal of FIG. 28 in this situation is for example equivalent to an erase set-feature signal which may comprise the set-feature command EFh and corresponding control information which follows the set-feature command EFh. The control information for example comprises the feature information FA associated with the erase operation and/or one or more parameter data P1, P2, P3, P4, and P5 to the flash memory device 110. The number and data lengths of parameter data are not intended to be a limitation. Alternatively, in an example of the write operation of SLC mode (or MLC/TLC/QLC mode and so on), the set-feature signal of FIG. 28 in this situation is equivalent to a write set-feature signal which may comprise the set-feature command EFh and corresponding control information which follows the set-feature command EFh. The control information for example comprises the feature information FA associated with the write operation and/or one or more parameter data P1, P2, P3, P4, and P5 to the flash memory device 110.

For setting the erase operation, the content of feature information FA is determined by the flash memory controller 105 and is to be associated with the erase operation. When receiving such feature information FA the flash memory device 110 can know that the following parameter data/bits is/are used for setting the erase operation. For example, the parameter data PD1 for example are implemented by four bits B0-B3 or more bits. In this embodiment, the bit B0 of parameter data PD1 is used to indicate whether to enable or disable the erase operation for a sequential mode. When the bit B0 is set as '1', the erase operation performed by the flash memory device 110 is enabled and configured as the sequential mode in which the erase operation is arranged to switch to process the different planes having different plane numbers sequentially. For instance, regardless of which plane number indicated by the address information sent by the flash memory controller 105, the address control circuit 1112 can automatically switch to the different planes having the different plane numbers, and the erase operation can be arranged to sequentially erase the block units having the same block index number such as 30 (but not limited) and respectively corresponding the different planes having the plane numbers 0-3 if the flash memory device has four planes. In other embodiment, the erase operation may automatically switch to erase block units having the same block index number 30 and respectively corresponding to the plane numbers 1-3 and erase a next block data unit having the block index number 31 at the plane having the plane number 0. This also falls within the scope of the invention.

Alternatively, when the bit B0 for the erase operation is set as '0', the erase operation is disabled. In this situation, the execution of the erase operation for the all the planes in response to one command sequence is disabled and stopped, and the flash memory controller 105 needs to send multiple command sequences, which respectively comprise the different plane information, to the flash memory device 110 to erase corresponding block data units of the different planes.

The bit B1 of parameter data PD1 for the erase operation is used to indicate whether the erase operation uses the updated bit map information sent from the flash memory controller 105 or automatically calculates and obtains the plane bit map information by itself for the different planes. When the bit B1 is set as '1', the erase operation is performed based on a plane bit map information which is automatically calculated and stored by the flash memory device 110. Alternatively, when the bit B1 is set as '0', the erase operation is performed based on a plane bit map information which is updated by the flash memory controller 105.

Figure 31:
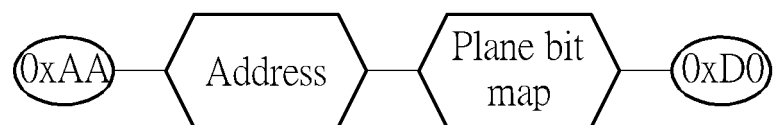
FIG. 31 is a diagram showing an example of the flash memory controller using other control information/signals to send the plane bit map information used for setting the erase operation according to an embodiment of the invention.

It should be noted that the plane bit map information, sent from the flash memory controller 105 to the flash memory device 110, can be transmitted by using the feature information FA or by using other control information/signals sent from the flash memory controller 105. FIG. 31 shows an example of the flash memory controller 105 using other control information/signals to send the plane bit map information used for setting the erase operation according to an embodiment of the invention. In FIG. 31, the flash memory controller 105 sends the specific indication command 0xAA, block/page address information, plane bit map information, and the command 0xD0. The plane bit map information may be position between the specific indication command 0xAA and the address information in other embodiment. The plane bit map information for example can be implemented by using at least one byte (but not limited) to indicate which plane(s) of the flash memory device 110 is to be processed by the erase operation triggered by this command sequence. That is, when the bit B1 of parameter data PD1 is set as '0', the flash memory device 110 can automatically erase the corresponding block data unit(s) for the plane(s) requested by the flash memory controller 105 based on the content of the plane bit map information received in such command sequence.

For example, if the address information indicate the block number 30 and the plane bit map information indicates '1010', then the flash memory device 110 can know and confirm that its erase operation is arranged to erase the block data units having the same block index number 30 and only corresponding to the planes having planes numbers 1 and 3. Further, it should be noted that the address information may also comprise another plane bit information, and the flash memory device 110 can ignore the another plane bit information when the bit B1 of parameter data PD1 is set as '0'. Further, since of the plane bit map information, the signal length of the command sequence for triggering an erase operation when the bit B1 of parameter data PD1 is set as "0" is different from that for triggering the erase operation when the bit B1 of parameter data PD1 is set as '1'.

The bit B2 of parameter data PD1 for setting the erase operation is used to indicate whether the erase operation can be performed in response to an erase command or in response to a specific indication command such as 0xAA. When the bit B2 is set as '1', the erase operation is configured to be performed in response to the specific indication command 0xAA. In this situation, the flash memory device 110 is arranged to automatically switch to and select the different planes even though one plane number is received. Alternatively, when the bit B2 is set as '0', the erase operation is configured to be performed in response to only the erase command 0x60. In this situation, the flash memory device 110 does not automatically switch processing the different planes. Further, in other embodiment, when the bit B2 is set as '1', the flash memory device 110 based on a default setting is arranged to automatically switch to and select the different planes, and the flash memory controller 105 further send a different specific indication command such as 0xBB (but not limited) to the flash memory device 110 to make the flash memory device 110 not switching to the different planes in addition to sending the command sequence associated with the erase operation.

Figure 32:
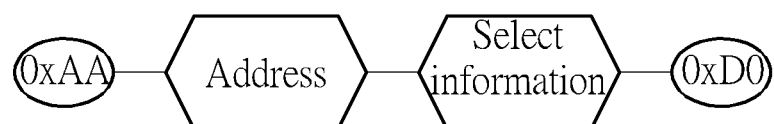
FIG. 32 is a diagram showing an example of the flash memory controller changing a block address/number for a different plane by sending the specific indication command 0xAA according to an embodiment of the invention.

The bit B3 of parameter data PD1 for setting the erase operation is used to indicate whether the erase operation can change block(s) for the different planes. When the bit B3 is set as '1', the erase operation can be performed to change a block address/number for a different plane in response to a request signal sent from the flash memory controller 105. Alternatively, when the bit B3 is set as '0', the erase operation is configured to be performed for the same block address/number for the different planes. Refer to FIG. 32. FIG. 32 shows an example of the flash memory controller 105 changing a block address/number for a different plane by sending the specific indication command 0xAA according to an embodiment of the invention. In FIG. 32, the flash memory controller 105 sequentially sends the specific indication command 0xAA, address information, select information, and an erase confirm command 0xD0. The select information for example can be implemented by using at least three bytes (but not limited) in which one byte can be used to indicate a plane number currently or dynamically selected/modified and other two bytes can be used to indicate a block number currently or dynamically selected/modified; however, this is not intended to be a limitation of the invention. For example, the address information may indicate only the plane numbers 1 and 3, and the select information can indicate a different plane number 0 to make the flash memory device 110 switch to and select the plane having the plane number 0. This is similar for the block changing.

In addition, the parameter data PD1 may comprise other bits used for reserved functions of setting the erase operation. The other parameter data PD2, PD3, PD4, and PD5 may be reserved for setting the erase operation. This is not intended to be a limitation of the invention.

Similarly, for setting the write operation of SLC/MLC/TLC/QLC mode, the feature information or parameter(s) of the write operation can be determined, enabled, or disabled by the flash memory controller 105 sending a write set-feature signal to the flash memory device 110. The feature information FA of write set-feature signal is determined by the flash memory controller 105 to be associated with the write operation under SLC, MLC, TLC, QLC, or other-level modes. The other formats of such write set-feature signal is similar to that of the erase set-feature signal or copy back read set-feature signal, and are not detailed for brevity. In addition, the select information of the write operation, used to change block/page unit for the different planes, may be positioned later than the address information or other positions in a simplified command sequence used to trigger the write operation under SLC/MLC/TLC/QLC mode.

Figure 33:
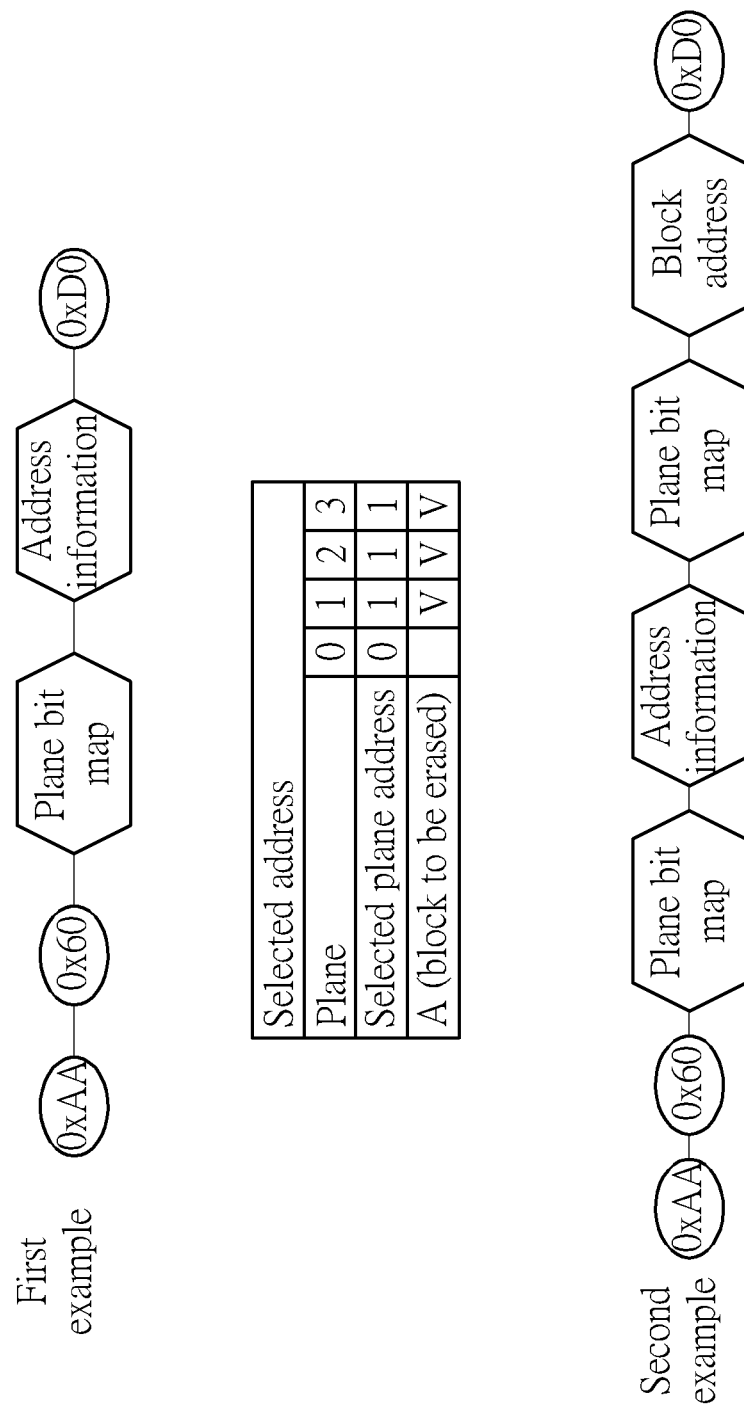
FIG. 33 is a diagram showing the examples of changing block address(es)/number(s) of different plane(s) for the erase operation in response to a request signal sent from the flash memory controller according to an embodiment of the invention.
Figure 34:
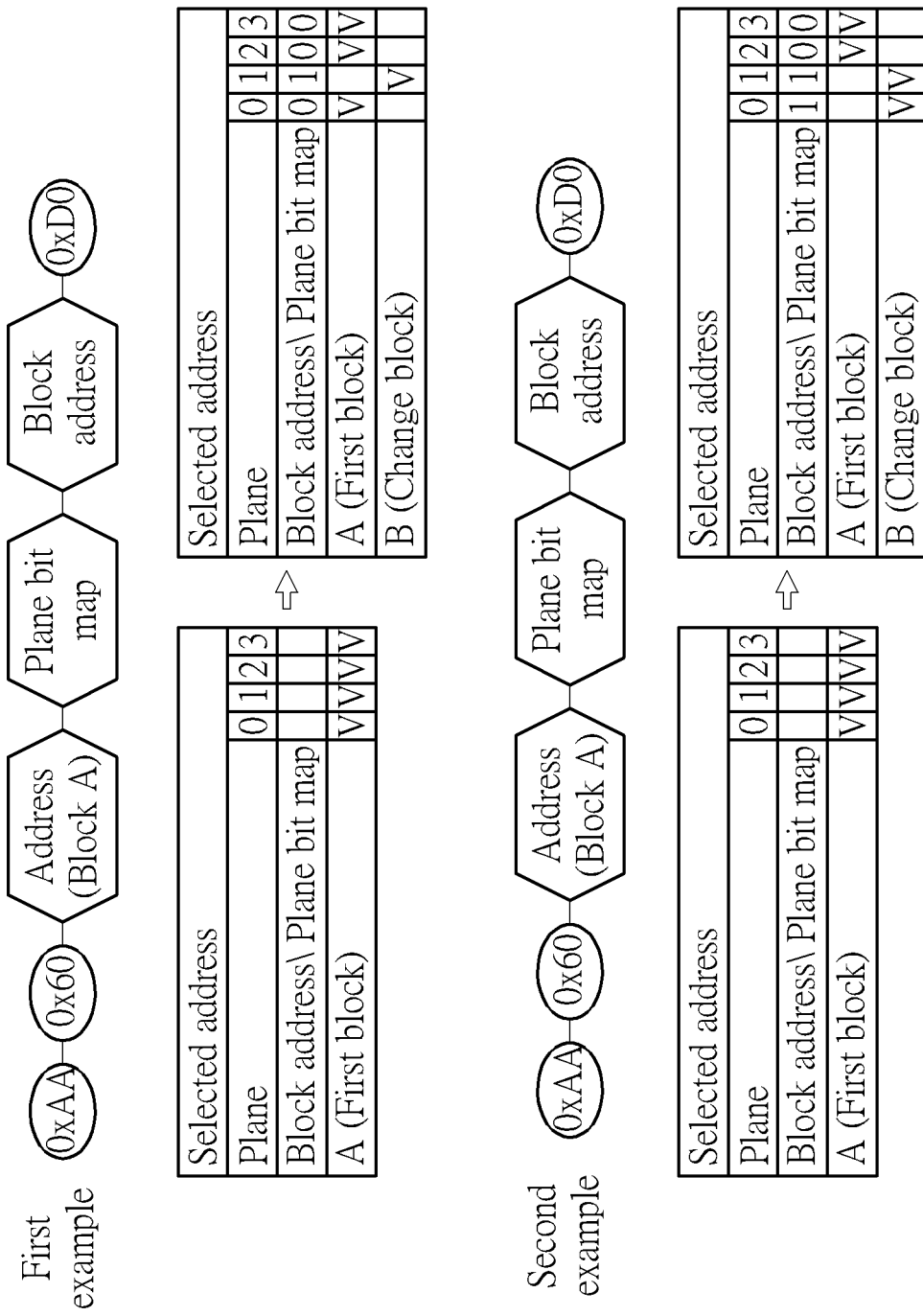
FIG. 34 is a diagram showing the example of changing block address(es)/number(s) of different plane(s) for the erase operation in response to a request signal sent from the flash memory controller according to other embodiment of the invention.
Figure 35:
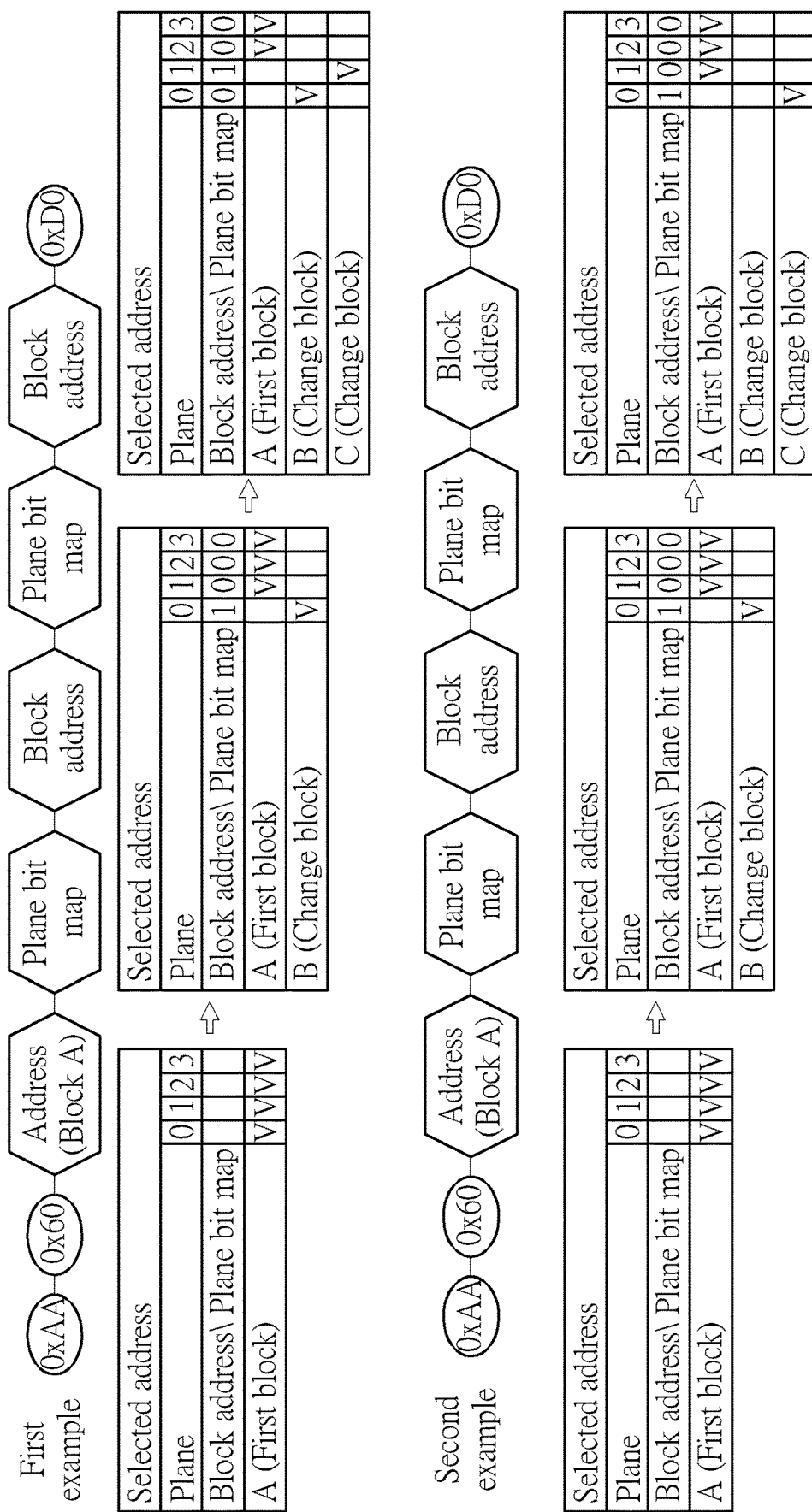
FIG. 35 is a diagram showing the example of changing block address(es)/number(s) of different plane(s) for the erase operation in response to a request signal sent from the flash memory controller according to other embodiment of the invention.

FIG. 33, FIG. 34, and FIG. 35 respectively show the examples of changing block address(es)/number(s) of different plane(s) for the erase operation in response to a request signal sent from the flash memory controller 105 according to different embodiments of the invention. In these examples, when the bit B3 of parameter data PD1 is set as '1', the erase operation can be performed to change a block address/number for a different plane in response to a request signal (e.g. a command sequence which triggers the erase operation) sent from the flash memory controller 105. The spirits of the following examples can be suitable for the data read, copy back read, and the write operation (under SLC, MLC, TLC, QLC, etc. modes). In other words, the flash memory controller 105 can send a simplified command sequence, associated with an access operation such as the data read, copy back read, erase, or the write operation, in which plane bit map information and/or block address information is/are added to indicate whether to change some plane/block address information.

As shown in FIG. 33, in the first example, the plane bit map information for the erase operation can be positioned before the address information in a command sequence; alternatively, the plane bit map information may be positioned after the address information in such command sequence. The flash memory controller 105 sequentially sends the specific indication command 0xAA, erase command 0x60, the plane bit map information (e.g. four bits '0111'), address information such as address data associated with a specific block address/number such as block address 'A', and the confirm command 0xD0. When the flash memory controller 105's erase operation is under the sequential mode the flash memory device 110 can know that its erase operation in the default setting is arranged to erase the block data units associated with the specific block address/number for all the different planes, and the flash memory device 110 can confirm that its erase operation in a modified configuration is arranged to erase the block data units associated with the specific block address/number for planes having the plane numbers 1-3 and does not erase a block data unit associated with the specific block address/number for the planes having the plane number 0 when receiving the plane bit map information which for example may carry information of '0111' (but not limited). This achieves that flash memory controller 105 can directly determine that a portion of planes of the flash memory device 110 is processed (to be erased) and another portion of plane(s) is/are not processed (not to be erased) by adding the plane bit map information into the simplified command sequence of the erase operation.

In the second example of FIG. 33, the flash memory controller 105 may sequentially send the specific indication command 0xAA, erase command 0x60, the first plane bit map information, the address information such as address data associated with a specific block address/number, the second plane bit map information, the block address information, and the confirm command 0xD0. The block address indicates which block address(es) is/are selected to be processed (i.e. to be erased). The first plane bit map information and the address information are associated with the sequential mode in which the flash memory device 110 can know that its erase operation in the default setting is arranged to erase the block data units associated with the specific block address/number for all the different planes. The first plane bit map information may have all bits identical to the logic bit '1'. The second plane bit map information, the block address information are associated with a modified configuration in which the flash memory device 110 can confirm that its erase operation is arranged to erase the block data units associated with the specific block address/number for plane(s) indicated by the second plane bit map information. All the medications obey the spirit of the invention.

As shown in the first example of FIG. 34, the flash memory controller 105 sequentially sends the specific indication command 0xAA, erase command 0x60, address information such as address data associated with a specific block address/number 'A', plane bit map information, block address information, and the confirm command 0xD0. The plane bit map information for example is implemented by four bits or one byte to indicate which plane(s) is/are selected to be processed (i.e. to be erased), and the block address information for example is implemented by two bytes to indicate which block address (es) is/are selected to be processed (i.e. to be erased). For example, the address information originally may indicate the specific block address/number such as block address 'A', and this means that the erase operation is applied for the block data units of the block address 'A' for all the different planes if no plane bit map information and no block address information are received.

Then, when receiving the plane bit map information such as bits '0010' respectively for plane numbers 3, 2, 1, and 0 and receiving the block address information such as block address 'B', the flash memory device 110 (or address control circuit 1112) may know and confirm that the erase operation is arranged to change the block address from 'A' to 'B' for the plane having plane number 1 indicated by plane bit map information. Thus, in the sequential mode for the erase operation, the flash memory controller 105 can erase the block data unit at the block address 'A' for the planes having the plane numbers 0, 2, and 3, and erase the block data unit at the block address 'B' for the plane having the plane number 1 after receiving the confirm command 0xD0 to start the execution of the erase operation.

Similarly, in the second example of FIG. 34, the flash memory controller 105 sequentially sends the specific indication command 0xAA, erase command 0x60, address information such as address data associated with the block address 'A', plane bit map information, block address information, and the confirm command 0xD0 wherein the plane bit map information for example indicates four bits '0011' respectively for plane numbers 3, 2, 1, and 0 to indicate two planes to be selected/processed and the block address information indicates the block address 'B' to be selected/processed. Thus, when receiving the plane bit map information such as '0011' and receiving the block address information such as block address 'B', the flash memory device 110 (or address control circuit 1112) may know and confirm that the erase operation is arranged to change the block address from 'A' to 'B' for only the planes having the numbers 0 and 1. Thus, in the sequential mode for the erase operation, the flash memory controller 105 can erase the block data units at the block address 'A' for the planes having the plane numbers 2 and 3, and erase the block data units at the block address 'B' for the plane having the plane numbers 0 and 1 after receiving the confirm command 0xD0 to start the execution of the erase operation.

Further, the flash memory controller 105 can dynamically select and process different blocks for the different planes. As shown in the first example of FIG. 35 for the erase operation, the flash memory controller 105 sequentially sends the specific indication command 0xAA, erase command 0x60, address information such as address data associated with a specific block address/number 'A', first plane bit map information, first block address information such as block address 'B', second plane bit map information, second block address information such as block address 'C', and the confirm command 0xD0. The first plane bit map information for example is implemented by four bits to indicate which plane(s) is/are selected to be processed for the first block address information such as block address 'B', and it for example is bits '0001' respectively for plane numbers 3, 2, 1, and 0 to indicate that only the plane having the plane number 0 is selected. The first block address information for example is implemented by two bytes to indicate that the block address 'B' is selected to be processed (i.e. to be erased). The second plane bit map information for example is implemented by four bits to indicate which plane(s) is/are selected to be processed for the second block address information such as block address 'C', and it for example is four bits '0010' respectively for plane numbers 3, 2, 1, and 0 to indicate that only the plane having the plane number 1 is selected. The second block address information for example is implemented by two bytes to indicate that the block address 'C' is selected to be processed (i.e. to be erased).

Thus, in the first example of FIG. 35, after receiving the address information associated with the specific block address/number 'A', the flash memory device 110 (or address control circuit 1112) can know that in the default setting its erase operation is arranged to erase the block data units corresponding to the block address 'A' for all the different planes. After receiving the first plane bit map information '0001' respectively for plane numbers 3, 2, 1, and 0 and the first block address information, the flash memory device 110 (or address control circuit 1112) can know that in a first modified manner the block address 'A' for the plane number 0 is changed and switched to the block address 'B' for the plane number 0. Similarly, after receiving the second plane bit map information '0010' respectively for plane numbers 3, 2, 1, and 0 and the second block address information, the flash memory device 110 (or address control circuit 1112) can know that in a second modified manner the block address 'A' for the plane number 1 is changed and switched to the block address 'C' for the plane number 1. Thus, after receiving the confirm command 0xD0, the flash memory device 110 (or address control circuit 1112) can and confirm that its erase operation is arranged to erase the block data units corresponding to the block address 'A' for the planes having the plane numbers 2-3, erase the block data unit corresponding to the block address 'B' for the plane having the plane number 0, and also erase the block data unit corresponding to the block address 'C' for the plane having the plane number 1. Thus, this can achieve processing (i.e. erasing) block data units corresponding to different block address information for the different planes by using/sending only one simplified command sequence from the flash memory controller 105 to the flash memory device 110.

As shown in the second example of FIG. 35 for the erase operation, the flash memory controller 105 sequentially sends the specific indication command 0xAA, erase command 0x60, address information such as address data associated with a specific block address/number 'A', first plane bit map information, first block address information such as block address 'B', second plane bit map information, second block address information such as block address 'C', and the confirm command 0xD0. The first plane bit map information for example is implemented by one byte to indicate which plane(s) is/are selected to be processed for the first block address information such as block address 'B', and it for example is four bits '0001' respectively for plane numbers 3, 2, 1, and 0 to indicate that the plane having the plane number 0 is selected. The first block address information for example is implemented by two bytes to indicate that the block address 'B' is selected to be processed (i.e. to be erased). The second plane bit map information for example is implemented by four bits to indicate which plane(s) is/are selected to be processed for the second block address information such as block address 'C', and it for example is bits '0001' respectively for plane numbers 3, 2, 1, and 0 to indicate that the plane having the plane number 0 is selected. The second block address information for example is implemented by two bytes to indicate that the block address 'C' is selected to be processed (i.e. to be erased). That is, the first plane bit map information is identical to the second plane bit map information in this example, and the first block address information is not identical to the second block address information. In this situation, after receiving the address information associated with the specific block address/number 'A', the flash memory device 110 (or address control circuit 1112) can know that in the default setting its erase operation is arranged to erase the block data units corresponding to the block address 'A' for all the different planes. After receiving the first plane bit map information '0001' respectively for plane numbers 3, 2, 1, and 0 and the first block address information, the flash memory device 110 (or address control circuit 1112) can know that in a first modified manner the block address 'A' for the plane number 0 is changed and switched to the block address 'B' for the plane number 0. Similarly, after receiving the second plane bit map information '0001' respectively for plane numbers 3, 2, 1, and 0 and the second block address information, the flash memory device 110 (or address control circuit 1112) can know that in a second modified manner the block address 'B' for the plane number 0 is changed again and switched to the block address 'C' for the plane number 0. Thus, after receiving the confirm command 0xD0, the flash memory device 110 (or address control circuit 1112) can and confirm that its erase operation is arranged to erase the block data units corresponding to the block address 'A' for the planes having the plane numbers 1-3 and also erase the block data unit corresponding to the block address 'C' for the plane having the plane number 0. Thus, this achieves changing different block address/number for the same plane for multiple times by using/sending only one simplified command sequence from the flash memory controller 105 to the flash memory device 110.

The method of using plane bit map information and block address information can be applied into a simplified command sequence for the read copy back operation or the write operation. For example, in one embodiment, at least one set of plane bit map information, block address information, and/or page bit map information can inserted and positioned into any position in a simplified command sequence of the write operation to particularly indicate which plane(s)/block(s)/page(s) are selected to be processed and which plane(s)/block(s)/page(s) are not selected. Similarly, in another embodiment, at least one set of plane bit map information, block address information, and/or page bit map information can inserted and positioned into any position in a simplified command sequence of the copy back read operation to particularly indicate which plane(s)/block(s)/page(s) are selected to be read from the memory cell array 1107 into the data register 1108 and which plane(s)/block(s)/page(s) are not selected. The corresponding operations are not detailed again for brevity.

Further, for a simplified command sequence, the specific indication command can be positioned at a starting position in such command sequence, any intermediate position in the command sequence, or at a last position in the command sequence. These modifications also fall within the scope of the invention.

To summarize, the invention provides schemes capable of simplifying multiple command sequences into one command sequence to improve the performance of the communications between a flash memory device and a flash memory controller so as to improve the whole performance of a storage device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory device to be used in a storage device and coupled to a flash memory controller of the storage device through a specific communication interface, comprising:
   an input/output (I/O) control circuit, coupled to the flash memory controller through the specific communication interface;
   a command register, coupled to the I/O control circuit;
   a memory cell array, having a first plane and a second plane, for at least storing a first data unit corresponding to the first plane and a second data unit corresponding to the second plane different from the first plane;
   a data register, coupled to the memory cell array, for buffering the first data unit and the second data unit transmitted from the memory cell array when a specific read command or a data toggle command, transmitted from the flash memory controller and through the I/O control circuit, is received and stored by the command register; and
   a control circuit, coupled to the command register, the data register, and the memory cell array, for performing a data toggle operation to control the data register selecting and transferring the first data unit and the second data unit to the I/O control circuit to make the I/O control circuit sequentially transmit the first data unit and the second data unit to the flash memory controller through the specific communication interface in response to the specific read command or the data toggle command, transmitted from the flash memory controller through the I/O control circuit and stored in the command register; a transmission of the first data unit is followed by a transmission of the second data unit.

2. The flash memory device of claim 1, further comprising:
   a logic control circuit, coupled to the flash memory controller through the specific communication interface and coupled to the control circuit; and
   a counter circuit, coupled to the logic control circuit and the control circuit;
   wherein the logic control circuit transmits a trigger signal to the counter circuit each time when a signal level of a read enable pin of the specific communication interface is changed by the flash memory controller; the counter circuit is arranged to count a counter value each time when receiving the trigger signal; and, when the counter value becomes equal to a mask value, the counter circuit sends an interrupt signal to the control circuit to make the control circuit select the second data unit as a next data unit and transmit the second data unit from the data register to the I/O control circuit, so as to transmit the second data unit from the I/O control circuit to the flash memory controller through the specific communication interface after the transmission of the first data unit is finished.

3. The flash memory device of claim 2, wherein the control circuit is arranged to store bit map information and the mask value, which are predetermined by the flash memory controller; the bit map information comprises multiple bits each being used to indicate whether a data unit of a specific plane is transmitted when the data toggle operation is executed.

4. The flash memory device of claim 3, wherein the bit map information and the mask value are determined by the flash memory controller when the flash memory device is supplied with power before the specific read command or the data toggle command is received.

5. The flash memory device of claim 4, wherein the bit map information and the mask value are configured by a data toggle set-feature signal transmitted from the flash memory controller.

6. The flash memory device of claim 2, wherein the counter circuit comprises:
   a counter, for counting and incrementing the counter value by one in response to the trigger signal transmitted from the logic control circuit, and for outputting the incremented counter value to an AND gate logic circuit; and
   the AND gate logic circuit, coupled to the counter, having a first input coupled to the mask value, a second input coupled to an output of the counter to receive the incremented counter value, and an output; the AND gate logic circuit performs an AND logic operation upon the incremented counter value and the mask value and generates the interrupt signal to the control circuit only when the incremented counter value is equal to the mask value.

7. The flash memory device of claim 2, wherein the counter circuit comprises:
   a counter, for counting down from the mask value and decrementing the counter value by one in response to the trigger signal transmitted from the logic control circuit, and for outputting the decremented counter value to an AND gate logic circuit; and
   the AND gate logic circuit, coupled to the counter, having a first input coupled to a value of zero, a second input coupled to an output of the counter to receive the decremented counter value, and an output; the AND gate logic circuit performs an AND logic operation upon the decremented counter value and the value of zero and generates the interrupt signal to the control circuit only when the decremented counter value is equal to the value of zero.

8. The flash memory device of claim 2, wherein the mask value is dynamically adjusted by the flash memory controller respectively for the first plane and the second plane.

9. The flash memory device of claim 1, wherein the memory cell array has another plane, and a serial number of the another plane is between a serial number of the first plane and a serial number of the second plane; a data unit of the another plane is not transmitted from the data register into the I/O control circuit in response to bit map information determined by the flash memory controller.

10. The flash memory device of claim 1, wherein the data toggle operation performed by the control circuit is to transmit a sequence of data units associated with different planes of the memory cell array in response to only one specific read command or only one data toggle command.

11. A method of a flash memory device to be used in a storage device and coupled to a flash memory controller of the storage device through a specific communication interface, the flash memory device having an input/output (I/O) control circuit, a command register, a memory cell array, a data register, and a control circuit, the I/O control circuit coupled to the flash memory controller through the specific communication interface, the command register coupled to the I/O control circuit, the memory cell array having a first plane and a second plane, and the method comprises:
   using the memory cell array for at least storing a first data unit corresponding to the first plane and a second data unit corresponding to the second plane different from the first plane;
   using the data register to buffer the first data unit and the second data unit transmitted from the memory cell array when a specific read command or a data toggle command, transmitted from the flash memory controller and through the I/O control circuit, is received and stored by the command register; and
   performing a data toggle operation to control the data register selecting and transferring the first data unit and the second data unit to the I/O control circuit to make the I/O control circuit sequentially transmit the first data unit and the second data unit to the flash memory controller through the specific communication interface in response to the specific read command or the data toggle command, transmitted from the flash memory controller through the I/O control circuit and stored in the command register;
   wherein a transmission of the first data unit is followed by a transmission of the second data unit.

12. The method of claim 11, further comprising:
   providing a logic control circuit coupled to the flash memory controller through the specific communication interface and coupled to the control circuit;
   providing a counter circuit coupled to the logic control circuit and the control circuit;
   using the logic control circuit to transmit a trigger signal to the counter circuit each time when a signal level of a read enable pin of the specific communication interface is changed by the flash memory controller;
   using the counter circuit to count a counter value each time when receiving the trigger signal; and
   when the counter value becomes equal to s mask value, using the counter circuit to send an interrupt signal to the control circuit to make the control circuit select the second data unit as a next data unit and transmit the second data unit from the data register to the I/O control circuit, to transmit the second data unit from the I/O control circuit to the flash memory controller through the specific communication interface after the transmission of the first data unit is finished.

13. The method of claim 12, further comprising:
   using the control circuit to store bit map information and the mask value, which are predetermined by the flash memory controller; the bit map information comprises multiple bits each being used to indicate whether a data unit of a specific plane is transmitted when the data toggle operation is executed.

14. The method of claim 13, wherein the bit map information and the mask value are determined by the flash memory controller when the flash memory device is supplied with power before the specific read command or the data toggle command is received.

15. The method of claim 14, wherein the bit map information and the mask value are configured by a data toggle set-feature signal transmitted from the flash memory controller.

16. The method of claim 12, wherein the counter circuit comprises a counter and an AND gate logic circuit, and the method further comprises:
   using the counter to count and increment the counter value by one in response to the trigger signal transmitted from the logic control circuit;
   outputting the incremented counter value to the AND gate logic circuit;
   using the AND gate logic circuit to perform an AND logic operation upon the incremented counter value and the mask value; and
   generating the interrupt signal only when the incremented counter value is equal to the mask value.

17. The method of claim 12, wherein the counter circuit comprises a counter and an AND gate logic circuit, and the method further comprises:
- using the counter to count down from the mask value;
- decrementing the counter value by one in response to the trigger signal transmitted from the logic control circuit;
- outputting the decremented counter value to the AND gate logic circuit;
- using the AND gate logic circuit to perform an AND logic operation upon the decremented counter value and a value of zero; and
- generating the interrupt signal only when the decremented counter value is equal to the value of zero.

18. The method of claim 12, wherein the mask value is dynamically adjusted by the flash memory controller respectively for the first plane and the second plane.

19. The method of claim 11, wherein the memory cell array has another plane, and a serial number of the another plane is between a serial number of the first plane and a serial number of the second plane; a data unit of the another plane is not transmitted from the data register into the I/O control circuit in response to bit map information determined by the flash memory controller.

20. The method of claim 11, wherein the data toggle operation performed by the control circuit is to transmit a sequence of data units associated with different planes of the memory cell array in response to only one specific read command or only one data toggle command.

* * * * *